US012362020B2

(12) United States Patent
Ozaki et al.

(10) Patent No.: US 12,362,020 B2
(45) Date of Patent: Jul. 15, 2025

(54) SEMICONDUCTOR MEMORY DEVICE HAVING A CONTROL CIRCUIT FOR CHANGING A DRIVE CAPABILITY OF AN OUTPUT CIRCUIT OF THE SEMICONDUCTOR MEMORY DEVICE

(71) Applicant: Kioxia Corporation, Tokyo (JP)

(72) Inventors: Shouichi Ozaki, Tokyo (JP); Kazuhiko Satou, Yokohama Kanagawa (JP); Kenro Kubota, Fujisawa Kanagawa (JP); Fumiya Watanabe, Chigasaki Kanagawa (JP); Atsuko Saeki, Yokohama Kanagawa (JP); Ryota Tsuchiya, Kamakura Kanagawa (JP); Harumi Abe, Kawasaki Kanagawa (JP); Toshifumi Watanabe, Tokyo (JP)

(73) Assignee: Kioxia Corporation, Tokyo (JP)

( * ) Notice: Subject to any disclaimer, the term of this patent is extended or adjusted under 35 U.S.C. 154(b) by 81 days.

(21) Appl. No.: 18/176,442

(22) Filed: Feb. 28, 2023

(65) Prior Publication Data
US 2024/0079067 A1 Mar. 7, 2024

(30) Foreign Application Priority Data
Sep. 1, 2022 (JP) .................................. 2022-138948

(51) Int. Cl.
*G11C 7/22* (2006.01)
*G11C 16/04* (2006.01)
*G11C 16/10* (2006.01)
*G11C 16/26* (2006.01)
*G11C 16/32* (2006.01)

(52) U.S. Cl.
CPC .......... *G11C 16/26* (2013.01); *G11C 16/0483* (2013.01); *G11C 16/10* (2013.01); *G11C 16/32* (2013.01)

(58) Field of Classification Search
CPC ..... G11C 16/26; G11C 16/0483; G11C 16/10; G11C 16/32; G11C 7/1051; G11C 7/1057
USPC ................................................... 365/189.011
See application file for complete search history.

(56) References Cited

U.S. PATENT DOCUMENTS

| 6,654,310 | B2 | 11/2003 | Nam |
| 7,236,012 | B2 | 6/2007 | Cho et al. |
| 10,825,506 | B2 | 11/2020 | Ho |
| 11,211,130 | B2* | 12/2021 | Hirashima ........... G11C 7/1087 |
| 11,232,051 | B2* | 1/2022 | Yamamoto .......... G06F 13/1689 |
| 2017/0154668 | A1* | 6/2017 | Ha ....................... G11C 29/021 |

\* cited by examiner

Primary Examiner — Tha-O H Bui
(74) Attorney, Agent, or Firm — Kim & Stewart LLP

(57) ABSTRACT

A semiconductor memory device includes an output pin configured for connection with a memory controller, an output circuit configured to output through the output pin a voltage signal that changes over time in accordance with one or more bits of data to be output to the memory controller, and a control circuit configured to temporarily change a drive capability of the output circuit each time a voltage signal corresponding to one bit of the data is output through the output pin.

17 Claims, 25 Drawing Sheets

SEMICONDUCTOR MEMORY DEVICE HAVING A CONTROL CIRCUIT FOR CHANGING A DRIVE CAPABILITY OF AN OUTPUT CIRCUIT OF THE SEMICONDUCTOR MEMORY DEVICE

CROSS-REFERENCE TO RELATED APPLICATION

This application is based upon and claims the benefit of priority from Japanese Patent Application No. 2022-138948, filed Sep. 1, 2022, the entire contents of which are incorporated herein by reference.

FIELD

Embodiments described herein relate generally to a semiconductor memory device.

BACKGROUND

A semiconductor memory device such as a NAND flash memory outputs signals such as read data to a memory controller.

DETAILED DESCRIPTION

Figure 1:
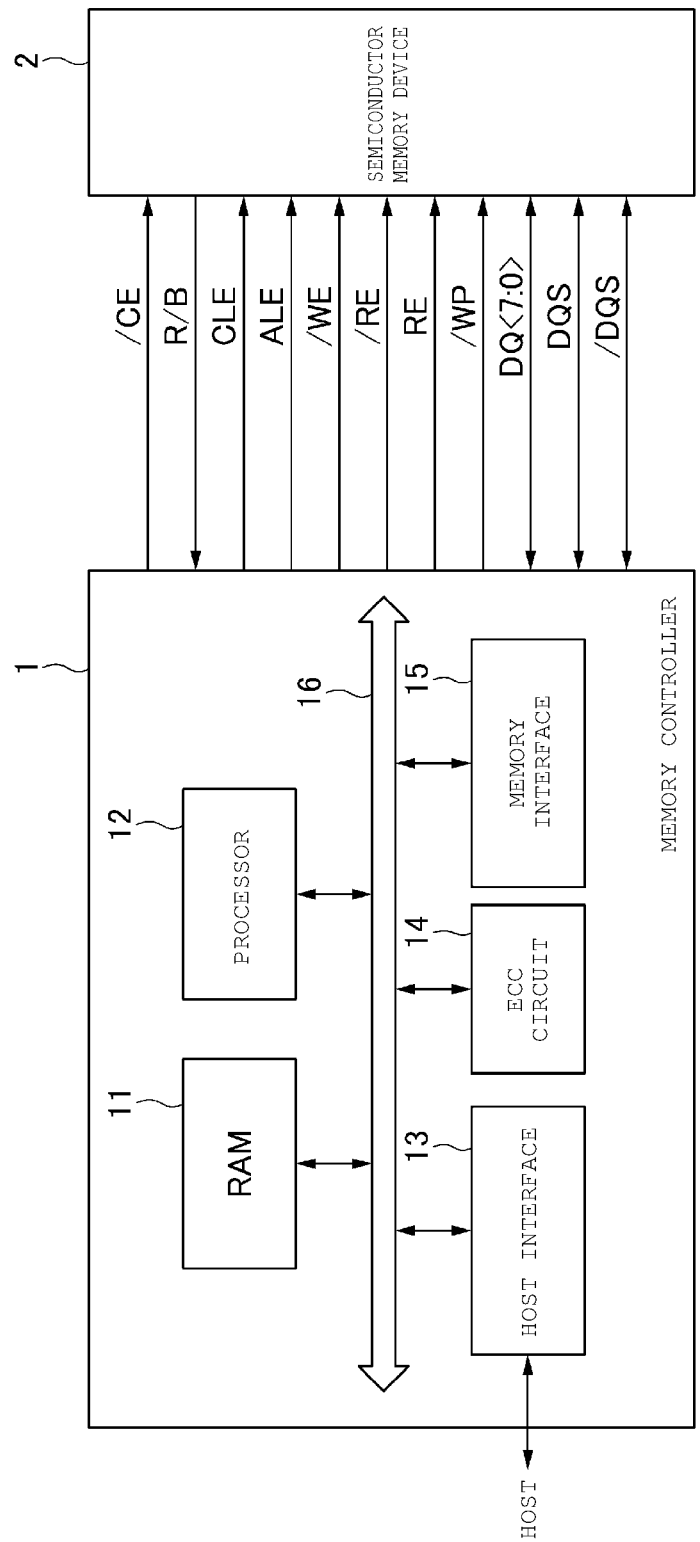
FIG. 1 is a block view showing a configuration example of a memory system according to a first embodiment.

Embodiments provide a semiconductor memory device that can stably output a signal.

In general, according to one embodiment, a semiconductor memory device includes an output pin configured for connection with a memory controller, an output circuit configured to output through the output pin a voltage signal that changes over time in accordance with one or more bits of data to be output to the memory controller, and a control circuit configured to temporarily change a drive capability of the output circuit each time a voltage signal corresponding to one bit of the data is output through the output pin.

Hereinafter, the present embodiment will be described with reference to the drawings. In order to facilitate understanding of the description, the same elements in each drawing are denoted by the same reference numerals as much as possible, and overlapping descriptions are omitted.

A semiconductor memory device 2 according to the present embodiment is a nonvolatile memory device configured as a NAND flash memory. FIG. 1 shows a block view of a configuration example of a memory system including the semiconductor memory device 2. The memory system includes a memory controller 1 and the semiconductor memory device 2.

Figure 2:
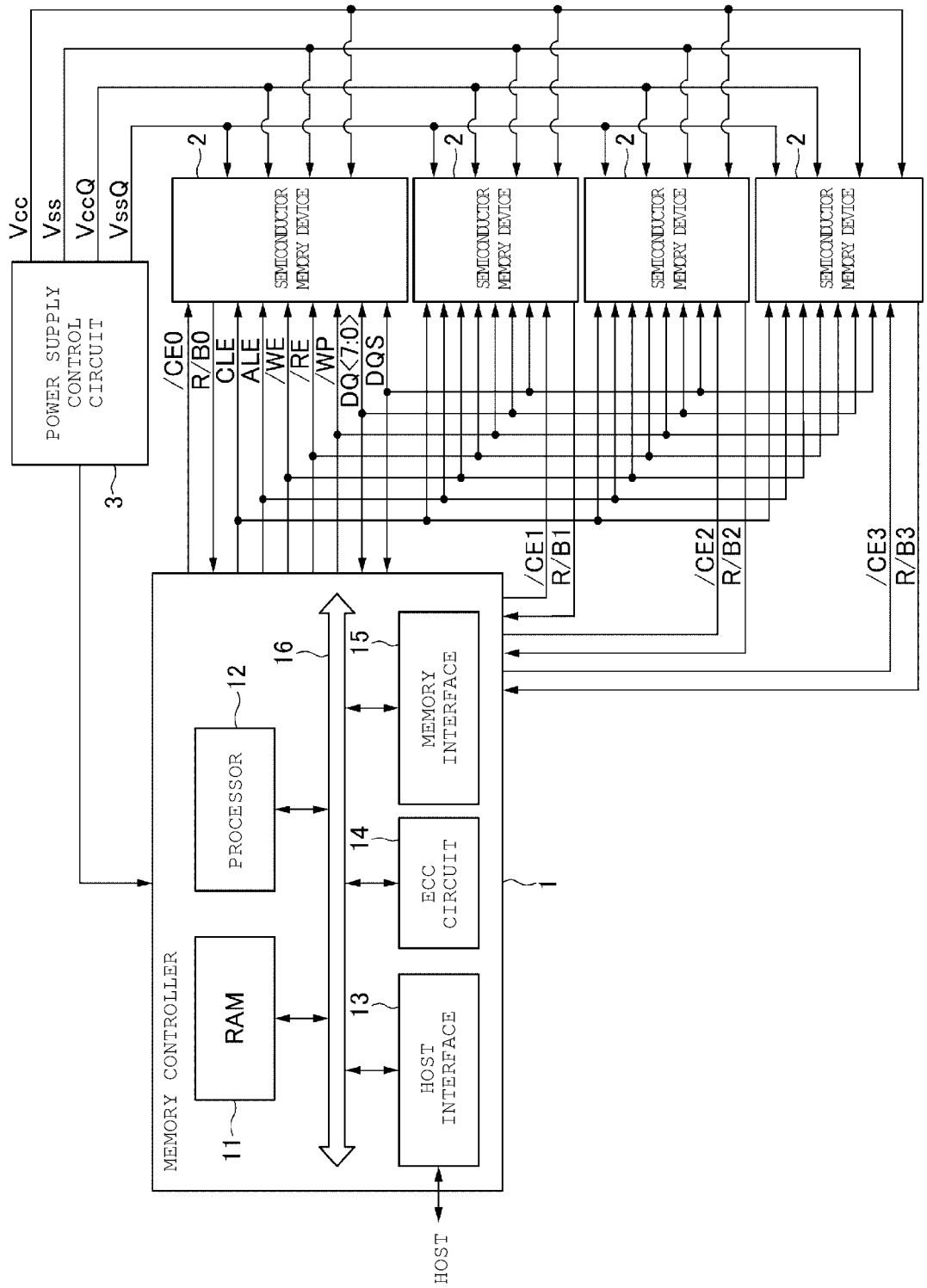
FIG. 2 is a block view showing a configuration example of the memory system according to the first embodiment.

In an actual memory system, a plurality of semiconductor memory devices 2 are provided with respect to one memory controller 1, as shown in FIG. 2. In FIG. 1, however, only one of the plurality of semiconductor memory devices 2 is illustrated. A specific configuration of the semiconductor memory device 2 will be described later.

The memory system can be connected to a host (not shown). The host is, for example, an electronic device such as a personal computer or a mobile terminal. The memory controller 1 controls writing of data to the semiconductor memory device 2 according to a write request from the host. Further, the memory controller 1 controls reading of data from the semiconductor memory device 2 according to a read request from the host.

Each of signals including a chip enable signal /CE, a ready busy signal R/B, a command latch enable signal CLE, an address latch enable signal ALE, a write enable signal /WE, read enable signals /RE and RE, a write protect signal /WP, data signals DQ <7:0>, and data strobe signals DQS, /DQS, is communicated between the memory controller 1 and the semiconductor memory device 2.

The chip enable signal /CE is a signal for enabling the semiconductor memory device 2. The ready busy signal R/B is a signal for indicating whether the semiconductor memory device 2 is in a ready state or a busy state. The "ready state" is a state of the semiconductor memory device 2 in which an external command can be received by the semiconductor memory device 2. The "busy state" is a state of the semiconductor memory device 2 in which an external command cannot be received by the semiconductor memory device 2.

As shown in FIG. 2, the chip enable signals /CE are individually transmitted to each of the plurality of semiconductor memory devices 2. In FIG. 2, each of the chip enable signals /CE is given a number as a suffix, for example, "/CE0" so as to be distinguished from each other.

Similarly, the ready busy signals R/B are individually transmitted from each of the plurality of semiconductor memory devices 2. In FIG. 2, each of the ready busy signals R/B is given a number as a suffix, for example, "R/B0" so as to be distinguished from each other.

The signals other than the chip enable signal /CE and the ready busy signal R/B (e.g., the command latch enable signal CLE and the like) are communicated between the memory controller 1 and the semiconductor memory device 2 via a signal line common to the plurality of semiconductor memory devices 2. The memory controller 1 uses the individual chip enable signal /CE to specify the semiconductor memory device 2 which is a target of communication.

The command latch enable signal CLE is a signal indicating that the signals DQ <7:0> are commands. The address latch enable signal ALE is a signal indicating that the signals DQ <7:0> are addresses. The write enable signal /WE is a signal instructing the semiconductor memory device 2 to receive data signals and is asserted each time the memory controller 1 receives a command, an address, and data. The memory controller 1 instructs the semiconductor memory device 2 to receive the signals DQ <7:0> while the signal /WE is at an "L (Low)" level.

The read enable signal /RE is a signal instructing the semiconductor memory device 2 to output data signals to the memory controller 1. The signal RE is a complementary signal of the signal /RE. These signals are used, for example, to control an operation timing of the semiconductor memory device 2 when the signals DQ <7:0> are output. The write protect signal /WP is a signal for instructing the semiconductor memory device 2 to prohibit data writing and erasing. The signals DQ <7:0> are data signals communicated between the semiconductor memory device 2 and the memory controller 1, and include commands, addresses, and data. The data strobe signal DQS is a signal for controlling an input/output timing of the signals DQ <7:0>. The signal /DQS is a complementary signal of the signal DQS.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other via an internal bus 16.

The host interface 13 outputs a request received from the host, user data (write data), or the like to the internal bus 16. Further, the host interface 13 transmits the user data read from the semiconductor memory device 2, a response from the processor 12, and the like to the host.

The memory interface 15 controls a process of writing the user data and the like to the semiconductor memory device 2 and a process of reading the user data and the like from the semiconductor memory device 2, based on an instruction from the processor 12.

The processor 12 comprehensively controls the memory controller 1. The processor 12 is, for example, a CPU, an MPU, or the like. When the processor 12 receives a request from the host via the host interface 13, the processor 12 performs control according to the request. For example, the processor 12 instructs the memory interface 15 to write the user data and a parity to the semiconductor memory device 2 according to the request from the host. Further, the processor 12 instructs the memory interface 15 to read the user data and the parity from the semiconductor memory device 2 according to the request from the host.

The processor 12 determines a storage area (a memory area) on the semiconductor memory device 2 with respect to the user data stored in the RAM 11. The user data is stored in RAM 11 via the internal bus 16. The processor 12 performs determination of the memory area with respect to data in page units (page data), which is the unit of writing. The user data, which is stored in one page of the semiconductor memory device 2, is hereinafter also referred to as "unit data". The unit data is generally encoded and is stored in the semiconductor memory device 2 as a code word. The encoding is not essential in the present embodiment. The memory controller 1 may store the unit data in the semiconductor memory device 2 without encoding, but FIG. 1 shows a configuration in which encoding is performed as one configuration example. When the memory controller 1 does not perform encoding, the page data matches the unit data. Further, one code word may be generated based on one unit data, or one code word may be generated based on divided data obtained by dividing the unit data. Further, one code word may be generated by using a plurality of unit data.

The processor 12 determines a memory area of the semiconductor memory device 2, which is a write destination, for each unit data. Physical addresses are assigned to the memory areas of the semiconductor memory device 2. The processor 12 manages the memory area that is a write destination of the unit data using the physical address. The processor 12 instructs the memory interface 15 to designate the determined memory area (the physical address) and write the user data to the semiconductor memory device 2. The processor 12 manages correspondence between logical addresses of the user data (logical addresses managed by the host) and physical addresses. When the processor 12 receives a read request including a logical address from the host, the processor 12 determines a physical address corresponding to the logical address, designates the physical address, and instructs the memory interface 15 to read the user data.

The ECC circuit 14 encodes the user data stored in the RAM 11 to generate a code word. Further, the ECC circuit 14 decodes the code word read from the semiconductor memory device 2. The ECC circuit 14 detects an error in data and corrects the errors by using, for example, checksums or the like added to the user data.

The RAM 11 temporarily stores user data, which is received from the host, until the user data is stored in the semiconductor memory device 2, and temporarily stores data, which is read from the semiconductor memory device 2, until the read data is transmitted to the host. The RAM 11 is, for example, general-purpose memory such as SRAM or DRAM.

FIG. 1 shows a configuration example in which the memory controller 1 includes each of the ECC circuit 14 and the memory interface 15. However, the ECC circuit 14 may be built into the memory interface 15. Further, the ECC circuit 14 may be built into the semiconductor memory device 2. The configuration or arrangement of each element shown in FIG. 1 is not limited to the particular configuration or arrangement shown in FIG. 1.

When a write request is received from the host, the memory system in FIG. 1 operates as follows. The processor 12 causes the RAM 11 to temporarily store data which is a target of a write operation. The processor 12 reads the data stored in the RAM 11 and inputs the data to the ECC circuit 14. The ECC circuit 14 encodes the input data and inputs a code word to the memory interface 15. The memory interface 15 writes the input code word to the semiconductor memory device 2.

When a read request is received from the host, the memory system in FIG. 1 operates as follows. The memory interface 15 inputs the code word read from the semiconductor memory device 2 to the ECC circuit 14. The ECC circuit 14 decodes the input code word and stores the decoded data in the RAM 11. Processor 12 transmits the data stored in the RAM 11 to the host via the host interface 13.

As shown in FIG. 2, the memory system of the present embodiment includes a power supply control circuit 3 in addition to the memory controller 1 and a plurality of semiconductor memory devices 2. The power supply control circuit 3 is a circuit for generating various voltages (such as VccQ or VssQ, which will be described later) necessary for an operation of the memory controller 1 or the semiconductor memory device 2, and for inputting the voltages to the semiconductor memory device 2. The power supply control circuit 3 may be packaged together with the memory controller 1 and the semiconductor memory device 2 or may be packaged separately from the memory controller 1 and the semiconductor memory device 2. Further, the power supply control circuit 3 may be configured as a part of the memory controller 1 or the semiconductor memory device 2.

Figure 3:
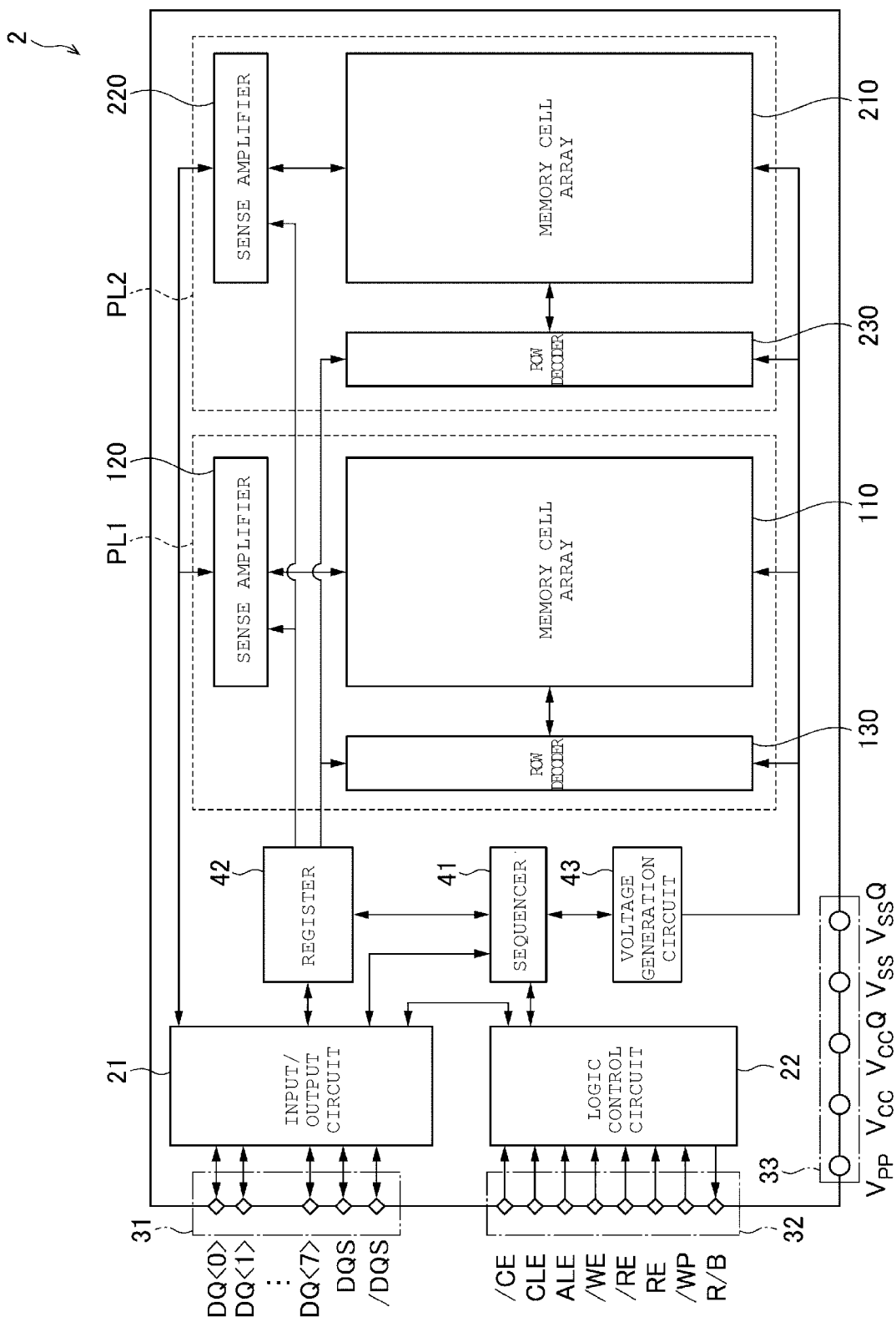
FIG. 3 is a block view showing a configuration of a semiconductor memory device according to the first embodiment.

A configuration of the semiconductor memory device 2 will be described. As shown in FIG. 3, the semiconductor memory device 2 includes two planes PL1 and PL2, an input/output circuit 21, a logic control circuit 22, a sequencer 41, a register 42, a voltage generation circuit 43, an input/output terminal group 31, a logic control terminal group 32, and a power supply input terminal group 33.

The plane PL1 includes a memory cell array 110, a sense amplifier 120, and a row decoder 130. Further, the plane PL2 includes a memory cell array 210, a sense amplifier 220, and a row decoder 230. A configuration of the plane PL1 and a configuration of the plane PL2 are identical to each other. That is, a configuration of the memory cell array 110 and a configuration of the memory cell array 210 are identical to each other, a configuration of the sense amplifier 120 and a configuration of the sense amplifier 220 are identical to each other, and a configuration of the row decoder 130 and a configuration of the row decoder 230 are identical to each other. The number of planes provided in the semiconductor memory device 2 may be two as in the present embodiment, but may be one, or may be three or more.

The memory cell array 110 and the memory cell array 210 are parts of the semiconductor memory device 2 that store data. The memory cell array 110 and the memory cell array 210 each include a plurality of memory cell transistors associated with word lines and bit lines. These specific configurations will be described later.

The input/output circuit 21 communicates the signals DQ <7:0> and the data strobe signals DQS and /DQS between the input/output circuit 21 and the memory controller 1. The input/output circuit 21 transfers commands and addresses in the signals DQ <7:0> to the register 42. Further, the input/output circuit 21 communicates the write data and the read data between the input/output circuit 21 and the sense amplifier 120 or the sense amplifier 220. The input/output circuit 21 has both a function as an "input circuit" that receives a command or the like from the memory controller 1 and a function as an "output circuit" that outputs data to the memory controller 1.

The logic control circuit 22 receives the chip enable signal /CE, the command latch enable signal CLE, the address latch enable signal ALE, the write enable signal /WE, the read enable signals RE and /RE, and the write protect signal /WP from the memory controller 1. Further, the logic control circuit 22 transfers the ready busy signal RB to the memory controller 1 to notify the outside of a state of the semiconductor memory device 2.

Both the input/output circuit 21 and the logic control circuit 22 are circuits from/to which signals are input/output to/from the memory controller 1. In other words, the input/output circuit 21 and the logic control circuit 22 are provided as interface circuits for the semiconductor memory device 2.

The sequencer 41 controls operations of each part of the semiconductor memory device 2 such as the planes PL1 and PL2, or the voltage generation circuit 43, based on a control signal input from the memory controller 1 to the semiconductor memory device 2.

The register 42 is a part that temporarily stores a command or an address. The register 42 is a part that also stores status information indicating states of each of the planes PL1 and PL2. The status information is output from the input/output circuit 21 to the memory controller 1 as a status signal in response to a request from the memory controller 1.

The voltage generation circuit 43 is a part that generates voltages necessary for each of a write operation, a read operation, and an erasing operation of data in the memory cell arrays 110 and 210, based on an instruction from the sequencer 41. Such voltages include, for example, voltages such as VPGM, VPASS_PGM, and VPASS_READ applied to a word line WL, which will be described later, and voltages applied to a bit line BL, which will be described later. The voltage generation circuit 43 can apply voltages individually to each of the word lines WL, the bit lines BL, or the like such that the plane PL1 and the plane PL2 can operate in parallel with each other.

The input/output terminal group 31 is a part provided with a plurality of terminals (pins) for communicating signals between the memory controller 1 and the input/output circuit 21. Each of the terminals is individually provided corresponding to each of the signals DQ <7:0> and the data strobe signals DQS and /DQS.

The logic control terminal group 32 is a part provided with a plurality of terminals (pins) for communicating each signal between the memory controller 1 and the logic control circuit 22. Each of the terminals is provided individually corresponding to each of the chip enable signal /CE, the command latch enable signal CLE, the address latch enable signal ALE, the write enable signal /WE, the read enable signals RE and /RE, the write protect signal /WP, and the ready busy signal RB.

The power supply input terminal group 33 is a part provided with a plurality of terminals (pins) for receiving the application of each voltage necessary for the operation of the semiconductor memory device 2. The voltages applied to each of the terminals include power supply voltages Vcc, VccQ, and Vpp, and ground voltages Vss and VssQ.

The power supply voltage Vcc is a circuit power supply voltage applied from an external power supply control circuit 3 as an operation power supply for the memory cell array 110 and the like. The power supply voltage Vcc is, for example, a voltage of substantially 2.5 V. The ground voltage Vss is a ground voltage used as a reference of the power supply voltage Vcc.

The power supply voltage VccQ is a voltage applied from the external power supply control circuit 3 as a voltage used when the signals DQ <7:0> and the like are communicated between the memory controller 1 and the semiconductor memory device 2, and for example, is a voltage of 1.2 V. The ground voltage VssQ is a ground voltage used as a reference of the power supply voltage VccQ.

The power supply voltage Vpp is a power supply voltage higher than the power supply voltage Vcc, and for example, is a voltage of 12 V. A high voltage (VPGM) of substantially 20 V is required when writing data to or erasing data from the memory cell arrays 110 and 210. At this time, a desired voltage can be generated at high speed and with low power consumption when the power supply voltage Vpp of substantially 12 V is boosted by a booster circuit of the voltage generation circuit 43, rather than the power supply voltage Vcc of substantially 2.5 V is boosted. On the other hand, for example, when the semiconductor memory device 2 is used in an environment in which a high voltage cannot be supplied, a voltage may not be supplied to the power supply voltage Vpp. Even when the power supply voltage Vpp is not supplied, the semiconductor memory device 2 can perform various operations as long as the power supply voltage Vcc is supplied. That is, the power supply voltage Vcc is a power supply that is normally supplied to the semiconductor memory device 2, and the power supply voltage Vpp is a power supply that is additionally or freely supplied according to the use environment, for example.

A voltage input from the power supply control circuit 3 to each terminal of the power supply input terminal group 33 is distributed to each part of the semiconductor memory device 2 and used for the operation of each part. In FIG. 3, each terminal of the power supply input terminal group 33 is depicted such that terminals are arranged in one place in a concentrated manner, but the actual arrangement of the terminals in the power supply input terminal group 33 is different from that shown in FIG. 3. The same applies to the input/output terminal group 31 and the logic control terminal group 32.

For example, in practice, in the power supply input terminal group 33, a plurality of terminals, to which the power supply voltage VccQ is input, are provided, and a part thereof is disposed at a location adjacent to the terminals of the power supply input terminal group 33.

The configuration of planes PL1 and PL2 will be described. As described above, the configuration of the plane PL1 and the configuration of the plane PL2 are identical to each other. Therefore, only the configuration of the plane PL1 will be described below, and illustration and description of the configuration of the plane PL2 will be omitted.

Figure 4:
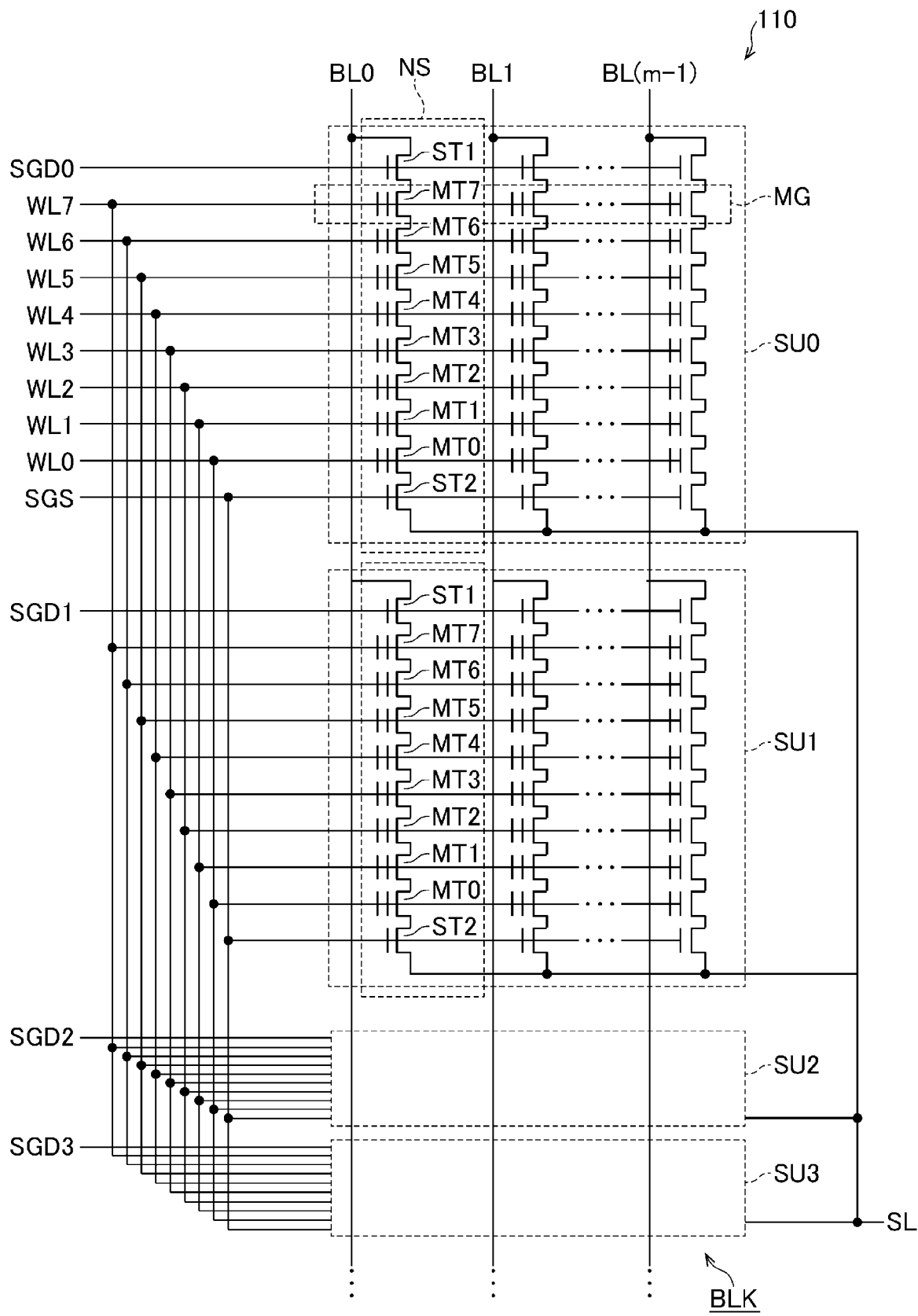
FIG. 4 is an equivalent circuit view showing a configuration of a memory cell array.

FIG. 4 shows a configuration of the memory cell array 110 provided on the plane PL1 as an equivalent circuit view. The memory cell array 110 includes a plurality of blocks BLK, but only one of these blocks BLK is illustrated in FIG. 4. A configuration of other blocks BLK in memory cell array 110 is also identical to the block BLK shown in FIG. 4.

As shown in FIG. 4, the block BLK includes, for example, four string units SU (SU0 to SU3). Further, each of the string units SU includes a plurality of NAND strings NS. Each of the NAND strings NS includes, for example, eight memory cell transistors MT (MT0 to MT7), and select transistors ST1 and ST2.

The number of memory cell transistors MT is not limited to eight and may be, for example, 32, 48, 64, or 96. For example, each of the select transistors ST1 and ST2 may include a plurality of transistors instead of a single transistor in order to improve cutoff characteristics. Furthermore, dummy cell transistors may be provided between the memory cell transistors MT and the select transistors ST1 and ST2.

The memory cell transistors MT are connected in series between the select transistor ST1 and the select transistor ST2. The memory cell transistor MT7 on one end side is connected to a source of the select transistor ST1, and the memory cell transistor MT0 on the other end side is connected to a drain of the select transistor ST2.

Gates of the respective select transistors ST1 in the string units SU0 to SU3 are commonly connected to the select gate lines SGD0 to SGD3, respectively. The gate of the select transistor ST2 is commonly connected to the same select gate line SGS across the plurality of string units SU within the same block BLK. The gates of the memory cell transistors MT0 to MT7 in the same block BLK are commonly connected to word lines WL0 to WL7, respectively. That is, the word lines WL0 to WL7 and the select gate line SGS are shared among the plurality of string units SU0 to SU3 within the same block BLK, whereas the select gate lines SGD are individually provided for each of the string units SU0 to SU3 even within the same block BLK.

The memory cell array 110 is provided with m bit lines BL (BL0, BL1, . . . , BL(m−1)). The above "m" is an integer representing the number of NAND strings NS in one string unit SU. A drain of the select transistor ST1 in each of the NAND strings NS is connected to the corresponding bit line BL. A source of the select transistor ST2 is connected to a source line SL. The source line SL is commonly connected across the sources of the plurality of select transistors ST2 in the block BLK.

Data stored in the plurality of memory cell transistors MT within the same block BLK are collectively erased. Meanwhile, reading and writing of the data are collectively performed for the plurality of memory cell transistors MT, which are connected to one word line WL and which belong to one string unit SU. Each of the memory cells can store 3-bit data including an upper bit, a middle bit, and a lower bit.

That is, the semiconductor memory device 2 according to the present embodiment uses a TLC method of storing 3-bit data in one memory cell transistor MT as a method of writing data to the memory cell transistor MT. Instead of such a method, the semiconductor memory device 2 may use an MLC method or the like of storing 2-bit data in one memory cell transistor MT as a method of writing data to the memory cell transistor MT. The number of bits of data stored in one memory cell transistor MT is not limited to any one particular number.

In the following description, a set of 1-bit data stored by the plurality of memory cell transistors MT, which are connected to one word line WL and which belong to one string unit SU, will be referred to as a "page". In FIG. 4, one of the sets configured with the plurality of memory cell transistors MT as described above is denoted by a code "MG".

When 3-bit data is stored in one memory cell transistor MT as in the present embodiment, a set of the plurality of memory cell transistors MT connected to a common word line WL within one string unit SU can store data for three pages. In the set, a page configured with a set of lower bit data is hereinafter also referred to as a "lower page", and data of the lower page is hereinafter also referred to as "lower page data". Similarly, a page configured with a set of middle bit data is hereinafter also referred to as a "middle page", and data of the middle page is hereinafter also referred to as "middle page data". A page configured with a set of upper bit data is hereinafter also referred to as an "upper page", and data of the upper page is hereinafter also referred to as "upper page data".

Figure 5:
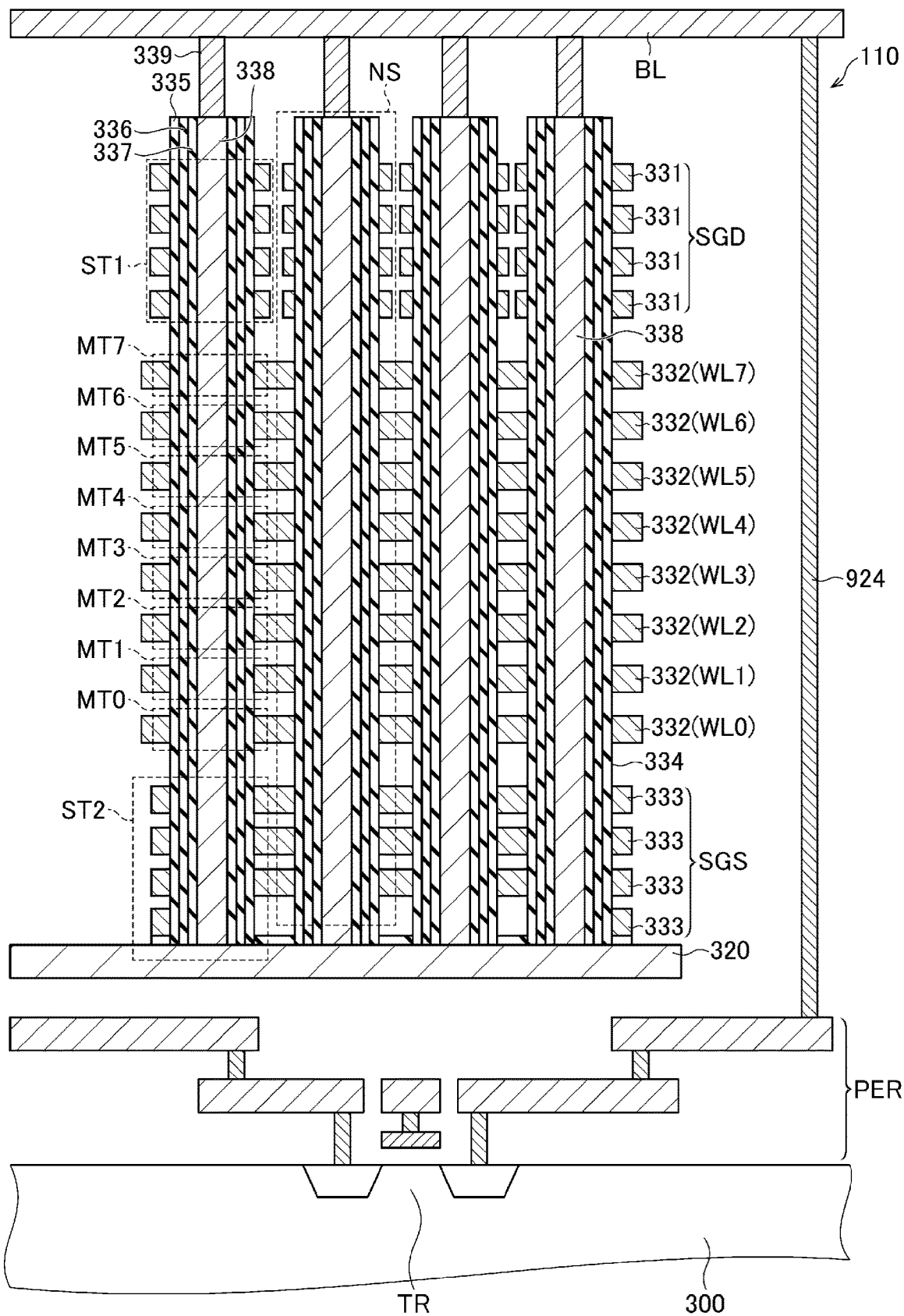
FIG. 5 is a cross-sectional view showing a configuration of a memory cell array.

FIG. 5 shows a schematic cross-sectional view of the memory cell array 110 and a peripheral configuration thereof. As shown in the figure, in the memory cell array 110, the plurality of NAND strings NS are formed on a conductive layer 320. The conductive layer 320 is also called a buried source line (BSL) and corresponds to the source line SL in FIG. 4.

A plurality of wiring layers 333 functioning as the select gate lines SGS, a plurality of wiring layers 332 functioning as the word lines WL, and a plurality of wiring layers 331 functioning as the select gate lines SGD are stacked above the conductive layer 320. An insulating layer (not shown) is disposed between each of the stacked wiring layers 333, 332, and 331.

A plurality of memory holes 334 are formed in the memory cell array 110. The memory hole 334 is a hole that vertically penetrates the wiring layers 333, 332, and 331, and the insulating layers (not shown), which are located between the wiring layers, and is a hole that reaches the conductive layer 320. A block insulating film 335, a charge storage layer 336, and a gate insulating film 337 are sequentially formed on a side surface of the memory hole 334, and a conductive post 338 is buried inside thereof. The conductive post 338 is made of polysilicon, for example, and functions as an area where a channel is formed during the operation of the memory cell transistors MT and the select transistors ST1 and ST2 in the NAND string NS. As described above, a columnar shape body, which is configured with the block insulating film 335, the charge storage layer 336, the gate insulating film 337, and the conductive post 338, is formed inside the memory hole 334.

Each of portions in the columnar shape body formed inside the memory hole 334 that intersects with each of the stacked wiring layers 333, 332, and 331 functions as a transistor. Among the plurality of transistors, transistors located in a portion intersecting the wiring layer 331 function as the select transistor ST1. Among the plurality of transistors, transistors located in a portion intersecting the wiring layer 332 function as the memory cell transistors MT (MT0 to MT7). Among the plurality of transistors, transistors located in a portion intersecting the wiring layer 333 function as the select transistor ST2. With such a configuration, each columnar shape body formed inside each memory hole 334 functions as the NAND string NS described with reference to FIG. 4. The conductive post 338 inside the columnar shape body is a portion that functions as a channel of the memory cell transistors MT and the select transistors ST1 and ST2.

A wiring layer functioning as the bit line BL is formed above the conductive post 338. A contact plug 339, which connects the conductive post 338 and the bit line BL, is formed at the upper end of the conductive post 338.

A plurality of configurations similar to the configuration shown in FIG. 5 are arranged along the depth direction of the paper surface in FIG. 5. One string unit SU is formed by a set of the plurality of NAND strings NS arranged in a row along the depth direction of the paper surface in FIG. 5.

In the semiconductor memory device 2 according to the present embodiment, a peripheral circuit PER is provided on a lower side of the memory cell array 110, that is, at a location between the memory cell array 110 and a semiconductor substrate 300. The peripheral circuit PER is a circuit provided for executing the write operation, the read operation, the erasing operation, and the like of the data in the memory cell array 110. A sense amplifier 120, a row decoder 130, a voltage generation circuit 43, and the like shown in FIG. 3 are parts of the peripheral circuit PER. The peripheral circuit PER includes various transistors, RC circuits, and the like. In the example shown in FIG. 5, the transistor TR formed on the semiconductor substrate 300 and the bit line BL located on the upper side of the memory cell array 110 are electrically connected via the contact 924.

Instead of such a configuration, a configuration in which the memory cell array 110 is provided directly on the semiconductor substrate 300 may be employed. In this case, a p-type well area of the semiconductor substrate 300 functions as the source line SL. Further, the peripheral circuit PER is provided at a location adjacent to the memory cell array 110 along the surface of the semiconductor substrate 300.

Returning to FIG. 3, the plane PL1 is provided with the sense amplifier 120 and the row decoder 130 in addition to the memory cell array 110 described above.

The sense amplifier 120 is a circuit for adjusting the voltage applied to the bit line BL, reading the voltage of the bit line BL, and converting the voltage into data. When data is read, the sense amplifier 120 acquires read data, which is read from the memory cell transistor MT to the bit line BL, and transfers the acquired read data to the input/output circuit 21. When data is written, the sense amplifier 120 transfers write data, which is written via the bit line BL, to the memory cell transistor MT.

The row decoder 130 is a circuit configured as a switch group (not shown) for applying a voltage to each of the word lines WL. The row decoder 130 receives a block address and a row address from the register 42, selects the corresponding block BLK based on the block address, and selects the corresponding word line WL based on the row address. The row decoder 130 switches between the opening and closing of the switch group such that the voltage from the voltage generation circuit 43 is applied to the selected word line WL.

Figure 6:
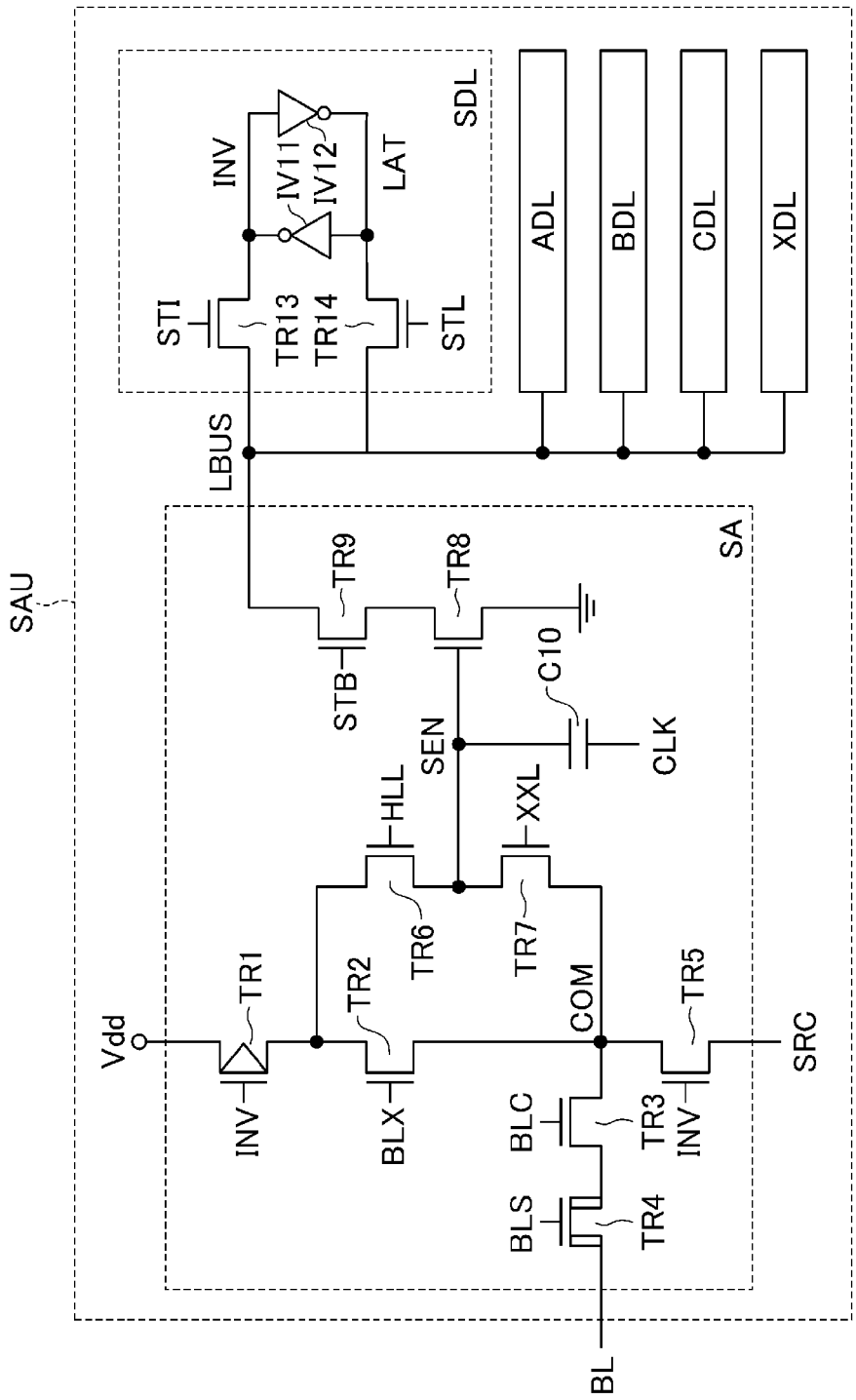
FIG. 6 is a view showing a circuit configuration of a sense amplifier unit.

FIG. 6 shows a configuration example of the sense amplifier 120. The sense amplifier 120 includes a plurality of sense amplifier units SAU respectively associated with a plurality of bit lines BL. FIG. 6 extracts and shows the detailed circuit configuration of one of these sense amplifier units SAU.

As shown in FIG. 6, the sense amplifier unit SAU includes a sense amplifier portion SA, and latch circuits SDL, ADL, BDL, CDL, and XDL. The sense amplifier portion SA, and the latch circuits SDL, ADL, BDL, CDL, and XDL are connected by a bus LBUS such that data can be communicated between each other.

For example, in the read operation, the sense amplifier portion SA senses data, which is read to the corresponding bit line BL, and determines whether the read data is "0" or "1". The sense amplifier portion SA includes, for example, a transistor TR1 that is a p-channel MOS transistor, transistors TR2 to TR9 that are n-channel MOS transistors, and a capacitor C10.

One end of the transistor TR1 is connected to a power supply line, and the other end of the transistor TR1 is connected to the transistor TR2. A gate of the transistor TR1 is connected to a node INV in a latch circuit SDL. One end of the transistor TR2 is connected to the transistor TR1, and the other end of the transistor TR2 is connected to a node COM. A signal BLX is input to a gate of the transistor TR2. One end of the transistor TR3 is connected to the node COM, and the other end of the transistor TR3 is connected to the transistor TR4. A signal BLC is input to a gate of the transistor TR3. The transistor TR4 is a high breakdown voltage MOS transistor. One end of the transistor TR4 is connected to the transistor TR3. The other end of the transistor TR4 is connected to the corresponding bit line BL. A signal BLS is input to a gate of the transistor TR4.

One end of the transistor TR5 is connected to the node COM, and the other end of the transistor TR5 is connected to a node SRC. The gate of transistor TR5 is connected to a node INV. One end of the transistor TR6 is connected between the transistors TR1 and TR2, and the other end of the transistor TR6 is connected to a node SEN. A signal HLL is input to a gate of the transistor TR6. One end of the transistor TR7 is connected to the node SEN, and the other end of the transistor TR7 is connected to the node COM. A signal XXL is input to a gate of the transistor TR7.

One end of the transistor TR8 is grounded, and the other end of the transistor TR8 is connected to the transistor TR9. A gate of transistor TR8 is connected to the node SEN. One end of the transistor TR9 is connected to the transistor TR8, and the other end of the transistor TR9 is connected to a bus LBUS. A signal STB is input to a gate of the transistor TR9. One end of capacitor C10 is connected to the node SEN. A clock CLK is input to the other end of the capacitor C10.

Signals BLX, BLC, BLS, HLL, XXL, and STB are generated by the sequencer 41, for example. Further, for example, a voltage Vdd, which is an internal power supply voltage of the semiconductor memory device 2, is applied to the power supply line that is connected to one end of the transistor TR1, and a voltage Vss, which is a ground voltage of the semiconductor memory device 2, is applied to the node SRC, for example.

The latch circuits SDL, ADL, BDL, CDL, and XDL temporarily store the read data. The latch circuit XDL is connected to the input/output circuit 21 and is used for the input/output of the data between the sense amplifier unit SAU and the input/output circuit 21. The read data can be output from the input/output circuit 21 to the memory controller 1 after being stored in the latch circuit XDL. For example, the data read by the sense amplifier unit SAU is stored in any one of the latch circuits ADL, BDL, and CDL, and then transferred to the latch circuit XDL, and output to the input/output circuit 21 from the latch circuit XDL. Further, for example, the data input from the memory controller 1 to the input/output circuit 21 is transferred from the input/output circuit 21 to the latch circuit XDL, and transferred from the latch circuit XDL to any one of the latch circuits ADL, BDL, and CDL.

The latch circuit SDL includes, for example, inverters IV11 and IV12, and transistors TR13 and TR14 which are n-channel MOS transistors. An input node of the inverter IV11 is connected to a node LAT. An output node of the inverter IV11 is connected to a node INV. An input node of the inverter IV12 is connected to the node INV. An output node of the inverter IV12 is connected to the node LAT. One end of the transistor TR13 is connected to the node INV, and the other end of the transistor TR13 is connected to the bus LBUS. A signal STI is input to a gate of the transistor TR13. One end of the transistor TR14 is connected to the node LAT, and the other end of the transistor TR14 is connected to the bus LBUS. A signal STL is input to a gate of the transistor TR14. For example, the data stored in the node LAT corresponds to the data stored in the latch circuit SDL. Further, the data stored in the node INV corresponds to the inverted data of the data stored in the node LAT. Since the circuit configurations of the latch circuits ADL, BDL, CDL, and XDL are identical to those of the latch circuit SDL, for example, the description thereof will be omitted.

Figure 7:
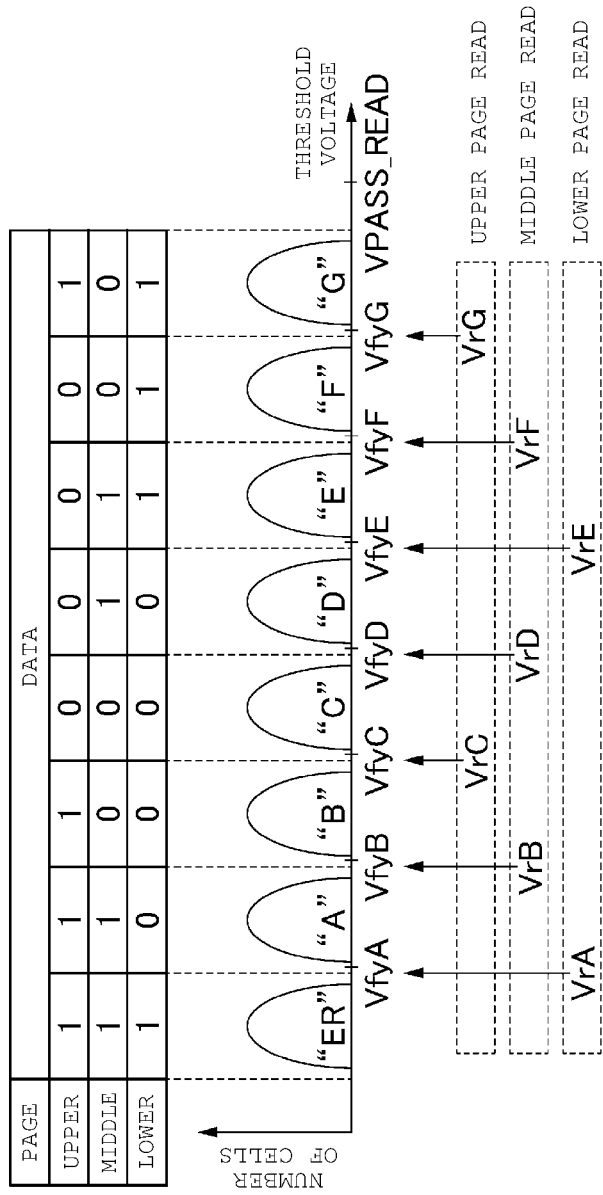
FIG. 7 is a view showing an example of threshold voltage distribution of memory cell transistors.

FIG. 7 is a view schematically showing a threshold voltage distribution and the like of the memory cell transistor MT. The view in the middle part in FIG. 7 represents a correspondence relationship between a threshold voltage of the memory cell transistor MT (horizontal axis) and the number of memory cell transistors MT (vertical axis).

When the TLC method is used as in the present embodiment, the plurality of memory cell transistors MT form eight threshold voltage distributions as shown in the middle part in FIG. 7. These eight threshold voltage distributions (corresponding to write levels) are defined to be in an "ER" state, an "A" state, a "B" state, a "C" state, a "D" state, an "E" state, an "F" state, and a "G" state in order of increasing the threshold voltage.

The table in the upper part in FIG. 7 represents an example of data assigned corresponding to each of the states of the threshold voltage. As shown in the table, for example, as shown below, 3-bit data, which are different from each other, are assigned to the "ER" state, "A" state, "B" state, "C" state, "D" state, "E" state, "F" state, and "G" state. "ER" state: "111" ("lower bit/middle bit/upper bit"), "A" state: "011", "B" state: "001", "C" state: "000", "D" state: "010", "E" state: "110", "F" state: "100", "G" state: "101".

As described above, the threshold voltage of the memory cell transistor MT in the present embodiment can take one of eight candidate states set in advance, and data is assigned as described above in correspondence with each of the candidate states.

A verify voltage, which is used in each of the write operations, is set between a pair of threshold voltage distributions adjacent to each other. Specifically, verify voltages VfyA, VfyB, VfyC, VfyD, VfyE, VfyF, and VfyG are set corresponding to the "A" state, "B" state, "C" state, "D" state, "E" state, "F" state, and "G" state, respectively.

For example, the verify voltage VfyA is set between the maximum threshold voltage at the "ER" state and the minimum threshold voltage at the "A" state. When the verify voltage VfyA is applied to the word line WL, the memory cell transistor MT, among the memory cell transistors MT connected to the word line WL, whose threshold voltage is included in the "ER" state enters an ON state, and the memory cell transistor MT whose threshold voltage is included in the threshold voltage distribution equal to or greater than the "A" state enters an OFF state.

Other verify voltages VfyB, VfyC, VfyD, VfyE, VfyF, and VfyG are also set in the same manner as the above verify voltage VfyA. The verify voltage VfyB is set between the "A" state and the "B" state, the verify voltage VfyC is set between the "B" state and the "C" state, the verify voltage VfyD is set between the "C" state and the "D" state, the verify voltage VfyE is set between the "D" state and the "E" state, the verify voltage VfyF is set between the "E" state and the "F" state, and the verify voltage VfyG is set between the "F" state and the "G" state.

For example, the verify voltage VfyA may be set to 0.8 V, the verify voltage VfyB may be set to 1.6 V, the verify voltage VfyC may be set to 2.4 V, the verify voltage VfyD may be set to 3.1 V, the verify voltage VfyE may be set to 3.8 V, the verify voltage VfyF may be set to 4.6 V, and the verify voltage VfyG may be set to 5.6 V, respectively. However, without being limited to this, the verify voltages VfyA, VfyB, VfyC, VfyD, VfyE, VfyF, and VfyG may be appropriately set stepwise within a range of 0 V to 7.0 V, for example.

Further, the read voltage used in each of the read operations is set between the threshold voltage distributions adjacent to each other. The "read voltage" is a voltage applied to the word line WL, which is connected to the memory cell transistor MT to be read, that is, the selected word line, during the read operation. In the read operation, data is determined based on the determination result of whether the threshold voltage of the memory cell transistor MT to be read is higher than the applied read voltage.

Specifically, as schematically shown in the figure at the lower part in FIG. 7, a read voltage VrA for determining whether the threshold voltage of the memory cell transistor MT is included in the "ER" state or included in a state that is equal to or greater than the "A" state, is set between the maximum threshold voltage at the "ER" state and the minimum threshold voltage at the "A" state.

Other read voltages VrB, VrC, VrD, VrE, VrF, and VrG are set similarly to the read voltage VrA. The read voltage VrB is set between the "A" state and the "B" state, the read voltage VrC is set between the "B" state and the "C" state, the read voltage VrD is set between the "C" state and the "D" state, the read voltage VrE is set between the "D" state and the "E" state, the read voltage VrF is set between the "E" state and the "F" state, and the read voltage VrG is set between the "F" state and the "G" state.

A read pass voltage VPASS_READ is set to a voltage higher than the maximum threshold voltage of the highest threshold voltage distribution (for example, the "G" state). The memory cell transistor MT, to which the read pass voltage VPASS_READ is applied to a gate, enters an ON state regardless of the stored data.

The verify voltages VfyA, VfyB, VfyC, VfyD, VfyE, VfyF, and VfyG are set to voltages higher than the read voltages VrA, VrB, VrC, VrD, VrE, VrF, and VrG, respectively, for example. That is, the verify voltages VfyA, VfyB, VfyC, VfyD, VfyE, VfyF, and VfyG are set in the vicinity of the lower tails of the threshold voltage distributions of the "A" state, "B" state, "C" state, "D" state, "E" state, "F" state, and "G" state, respectively.

When data allocation as described above is applied, one page data of the lower bit (lower page data) in the read operation can be determined based on a read result using the read voltages VrA and VrE. One page data of the middle bit (middle page data) can be determined based on a read result using the read voltages VrB, VrD, and VrF. One page data of the upper bit (upper page data) can be determined based on a read result using the read voltages VrC and VrG. As described above, since the lower page data, the middle page data, and the upper page data are determined by two times, three times, and two times read operations, respectively, the above described data allocation is referred to as a "2-3-2 code".

The data assignment as described above is merely an example, and the actual data assignment is not limited to this. For example, data of 2-bit or 4-bit or more may be stored in one memory cell transistor MT. Further, the number of threshold voltage distributions to which data is assigned (that is, the number of "candidate states" described above) may be seven or less, or nine or more. For example, instead of "2-3-2 code", "1-3-3 code" or "1-2-4 code" may be used. Further, for example, the assignment of the lower bit/middle bit/upper bit may be changed. More specifically, for example, in the "2-3-2 code", data may be assigned such that the lower page data is determined based on the read result using read voltages VrC and VrB, the middle page data is determined based on the read result using read voltages VrB, VrD, and VrF, and the upper page data is determined based on the read result using the read voltages VrA and VrE. That is, for example, the assignment of the lower bit and the upper bit may be interchanged. In this case, data are assigned as follows corresponding to each of the states of the threshold voltage. "ER" state: "111" ("lower bit/middle bit/upper bit"), "A" state: "110", "B" state: "100", "C" state: "000", "D" state: "010", "E" state: "011", "F" state: "001", "G" state: "101".

The write operation performed in the semiconductor memory device 2 will be described. A program operation and a verification operation are performed in the write operation. The "program operation" is an operation of injecting electrons into the charge storage layer 336 of a part of the memory cell transistors MT to change the threshold voltage of the memory cell transistors MT. The "verification operation" is an operation of reading data after the program operation described above to determine and verify whether the threshold voltage of the memory cell transistor MT has reached a target state. The memory cell transistor MT whose threshold voltage has reached the target state is then write protected. The "target state" referred to here is a specific candidate state set as a target state among the eight candidate states described above.

In the write operation, the above program operation and a verification operation are repeatedly executed. As a result, the threshold voltage of memory cell transistor MT rises to the target state.

Among the plurality of word lines WL, the word line WL, which is connected to the memory cell transistor MT that is a target of the write operation (that is, the target of changing the threshold voltage) is hereinafter also referred to as a "selected word line". Further, the word line WL, which is connected to the memory cell transistor MT that is not the target of the write operation, is hereinafter also referred to as an "non-selected word line". The memory cell transistor MT that is a write target is hereinafter also referred to as a "selected memory transistor".

Among the plurality of string units SU, the string unit SU that is a target of the write operation is hereinafter also referred to as a "selected string unit". Further, the string unit SU that is not the target of the write operation is hereinafter also referred to as an "non-selected string unit".

The conductor post 338 of each NAND string NS in the selected string unit, that is, each channel in the selected string unit, is hereinafter also referred to as a "selected channel". Further, the conductor post 338 of each NAND string NS in the non-selected string unit, that is, each channel in the non-selected string unit, is hereinafter also referred to as an "non-selected channel".

Among the plurality of bit lines BL, the bit line BL, which is connected to the selected memory transistor, is hereinafter also referred to as a "selected bit line". Further, the bit line BL that is not connected to the selected memory transistor is hereinafter also referred to as an "non-selected bit line".

Figure 8:
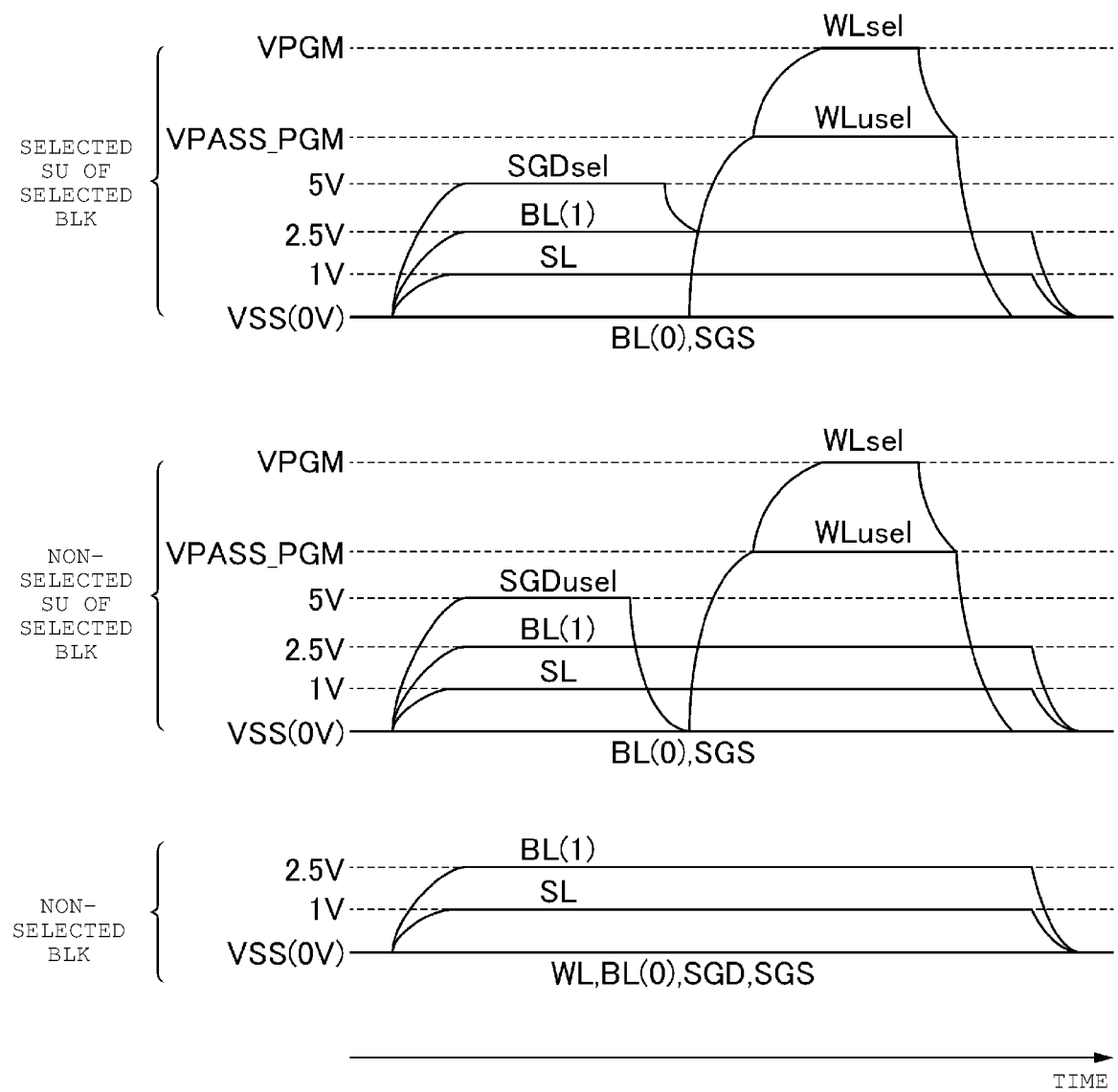
FIG. 8 is a view showing voltage changes in each wiring during a write operation.

The program operation will be described. An example in which a target of the program operation is the plane PL1 will be described below, and the same applies to the plane PL2. FIG. 8 shows a voltage change in each wiring during the program operation. In the program operation, the sense amplifier 120 changes the voltage of each bit line BL according to the program data. A ground voltage Vss (0 V), for example, is applied as the "L" level to the bit line BL connected to the memory cell transistor MT that is a program target (the threshold voltage of which is to be increased). 2.5 V, for example, is applied as the "H" level to the bit line BL connected to the memory cell transistor MT that is not a program target (the threshold voltage of which is to be maintained). The former bit line BL is indicated as "BL(0)" in FIG. 8. The latter bit line BL is indicated as "BL(1)" in FIG. 8.

The row decoder 130 selects any one of the blocks BLK as the target of the write operation and further selects any one of the string units SU. More specifically, 5 V, for example, is applied to the select gate line SGD (selected select gate line SGDsel) in the selected string unit SU from the voltage generation circuit 43 via the row decoder 130. As a result, the select transistor ST1 enters an ON state. Meanwhile, the voltage Vss, for example, is applied to the select gate line SGS from the voltage generation circuit 43 via the row decoder 130. As a result, the select transistor ST2 enters an OFF state.

Further, 5 V, for example, is applied to the select gate line SGD of the non-selected string unit SU (non-selected select gate line SGDusel) in the selected block BLK from the voltage generation circuit 43 via the row decoder 130. As a result, the select transistor ST1 enters an ON state. The select gate line SGS is commonly connected across the string units SU in each block BLK. Therefore, the select transistor ST2 enters an OFF state in the non-selected string unit SU as well.

Further, the voltage Vss, for example, is applied to the select gate line SGD and the select gate line SGS in the non-selected block BLK from the voltage generation circuit 43 via the row decoder 130. As a result, the select transistor ST1 and the select transistor ST2 enter an OFF state.

The source line SL is set to a higher voltage than the voltage of the select gate line SGS. The voltage is, for example, 1 V.

Thereafter, the voltage of the selected select gate line SGDsel in the selected block BLK is set to 2.5 V, for example. This voltage turns on the select transistor ST1 corresponding to the bit line BL(0) to which 0 V is applied in the above example, and is a voltage for cutting off the select transistor ST1 corresponding to the bit line BL(1) to which 2.5 V is applied. As a result, in the selected string unit SU, the select transistor ST1 corresponding to the bit line BL(0) is turned on, and the select transistor ST1 corresponding to the bit line BL(1) to which 2.5 V is applied is cut off. On the other hand, the voltage of the non-selected select gate line SGDusel is set to the voltage Vss, for example. As a result, in the non-selected string unit SU, the select transistor ST1 is cut off regardless of the voltages of the bit line BL(0) and the bit line BL(1).

The row decoder 130 selects any one of the word lines WL as the target of the write operation in the selected block BLK. A voltage VPGM, for example, is applied to the word line WL (selected word line WLsel) that becomes a target of the write operation from the voltage generation circuit 43 via the row decoder 130. Meanwhile, the voltage VPASS_PGM, for example, is applied to the other word lines WL (non-selected word lines WLusel) from the voltage generation circuit 43 via the row decoder 130. The voltage VPGM is a high voltage for injecting electrons into the charge storage layer 336 by tunneling phenomenon. The voltage VPASS_PGM turns on the memory cell transistor MT, which is connected to the word line WL, and is a voltage that does not change the threshold voltage. The VPGM is a higher voltage than the VPASS_PGM.

In the NAND string NS corresponding to the bit line BL(0) that is a program target, the select transistor ST1 enters an ON state. Therefore, the channel voltage of the memory cell transistor MT, which is connected to the selected word line WLsel, becomes 0 V. A voltage difference between a control gate and a channel increases, and as a result, electrons are injected into the charge storage layer 336, so the threshold voltage of the memory cell transistor MT is increased.

In the NAND string NS corresponding to the bit line BL(1) that is not a program target, the select transistor ST1 enters a CUT OFF state. Therefore, the channel of the memory cell transistor MT, which is connected to the selected word line WLsel, becomes electrically floating and a channel voltage rises near the voltage VPGM by capacitance coupling with the word line WL and the like. A voltage difference between the control gate and the channel decreases, and as a result, electrons are not injected into the charge storage layer 336, so the threshold voltage of the memory cell transistor MT is maintained. To be precise, the threshold voltage does not fluctuate so much that a threshold voltage distribution level transitions to a higher distribution.

Figure 9:
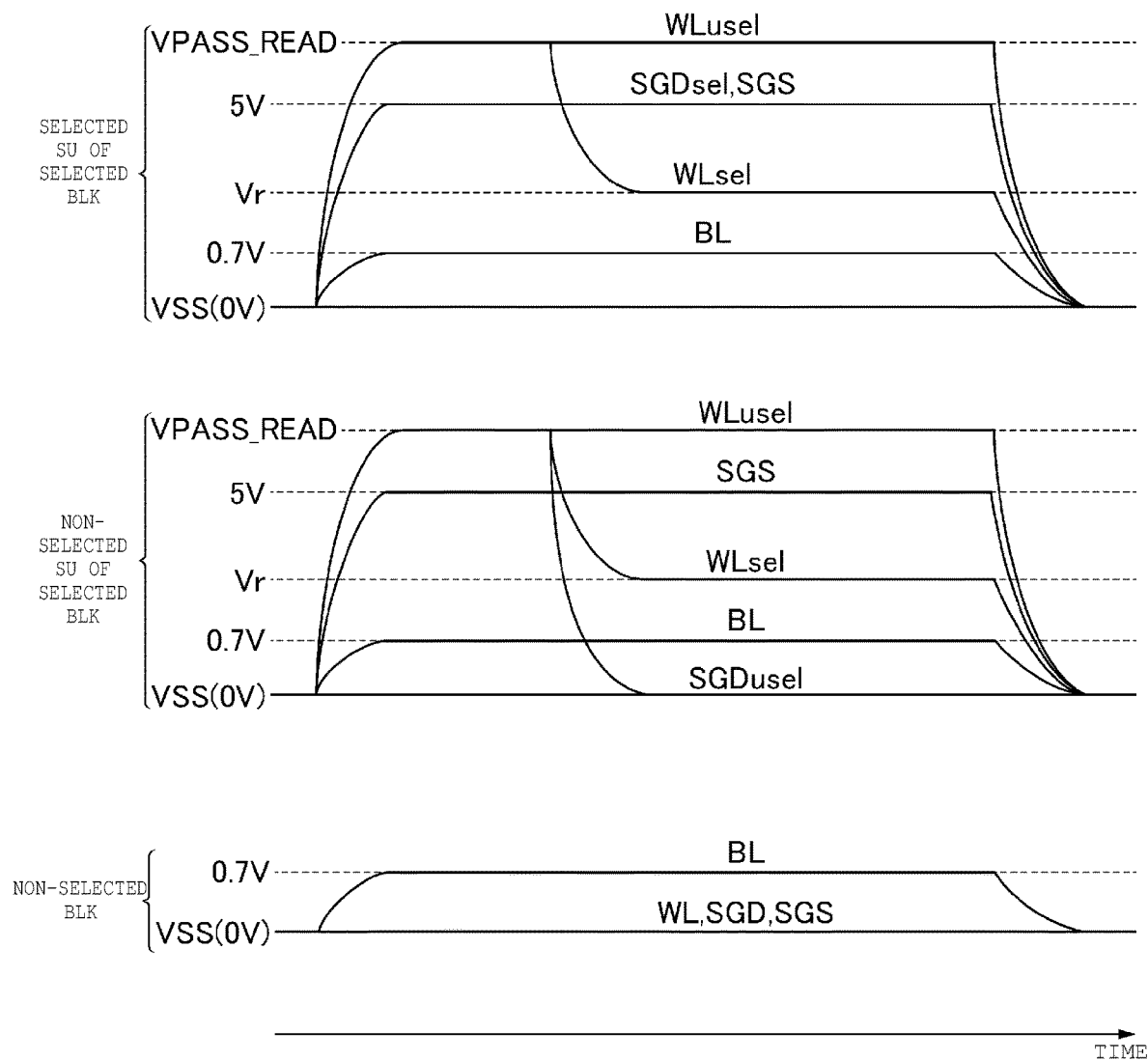
FIG. 9 is a view showing voltage changes in each wiring during a read operation.

The read operation will be described. An example in which a target of the read operation is the plane PL1 will be described below, and the same applies to the plane PL2. A verification operation, which is performed after the program operation, is the same as the read operation described below. FIG. 9 shows a voltage change in each wiring during the read operation. In the read operation, the NAND string NS including the memory cell transistors MT, which becomes a target of the read operation, is selected. Alternatively, the string unit SU including a page, which becomes a target of the read operation, is selected.

First, 5 V, for example, is applied to the selected select gate line SGDsel, the non-selected select gate line SGDusel, and the select gate line SGS from the voltage generation circuit 43 via the row decoder 130. As a result, the select transistor ST1 and the select transistor ST2 in the selected block BLK enter an ON state. Further, the read pass voltage VPASS_READ, for example, is applied to the selected word line WLsel and the non-selected word line from the voltage generation circuit 43 via the row decoder 130. The read pass voltage VPASS_READ is a voltage that can turn on the memory cell transistor MT regardless of the threshold voltage of the memory cell transistor MT and does not change the threshold voltage. As a result, current flows in all the NAND strings NS in the selected block BLK regardless of whether it is the selected string unit SU or the non-selected string unit SU.

Next, a read voltage Vr such as VrA, for example, is applied to the word line WL (selected word line WLsel), which is connected to the memory cell transistor MT that becomes a target of the read operation, from the voltage generation circuit 43 via the row decoder 130. The read pass voltage VPASS_READ is applied to the rest of word lines (non-selected word lines WLusel).

Further, the voltage Vss, for example, is applied to the non-selected select gate line SGDusel from the voltage generation circuit 43 via the row decoder 130 while maintaining the voltage applied to the selected select gate line SGDsel and the select gate line SGS. As a result, the select transistor ST1 in the selected string unit SU maintains an ON state, but the select transistor ST1 in the non-selected string unit SU enters an OFF state. Regardless of whether it is the selected string unit SU or the non-selected string unit SU, the select transistor ST2 in the selected block BLK enters an ON state.

As a result, the NAND string NS in the non-selected string unit SU does not form a current path because at least the select transistor ST1 is in an OFF state. Meanwhile, a current path is formed or not formed in the NAND string NS in the selected string unit SU according to a relationship between the read voltage Vr, which is applied to the selected word line WLsel, and the threshold voltage of the memory cell transistor MT.

The sense amplifier 120 applies a voltage to the bit line BL connected to the selected NAND string NS. In this state, the sense amplifier 120 reads data based on a value of the current flowing through the bit line BL. Specifically, it is determined whether the threshold voltage of the memory cell transistor MT, which becomes a target of the read operation, is higher than the read voltage applied to the memory cell transistor MT. Data may be read not based on a value of the current flowing through the bit line BL, but based on the temporal change in the voltage on the bit line BL. In the latter case, the bit line BL is pre-charged to be a predetermined voltage.

The verification operation described above is also performed in the same manner as the read operation described above. In the verification operation, a verify voltage such as VfyA is applied to the word line WL, which is connected to the memory cell transistor MT that becomes a target of the verification, from the voltage generation circuit 43 via the row decoder 130.

An operation of applying a voltage of 5 V to the selected select gate line SGDsel and the non-selected select gate line SGDusel in an initial stage of the program operation described above may be omitted. Similarly, an operation of applying a voltage of 5 V to the non-selected select gate line SGDusel and applying the read pass voltage VPASS_READ to the selected word line WLsel in the initial stage of the read operation (or the verification operation) described above may be omitted.

A specific flow of signals communicated between the semiconductor memory device 2 and the memory controller 1 during the read operation will be described. An example in which a target of the read operation is the plane PL1 will be described below, and the same applies to the plane PL2.

Figure 10:
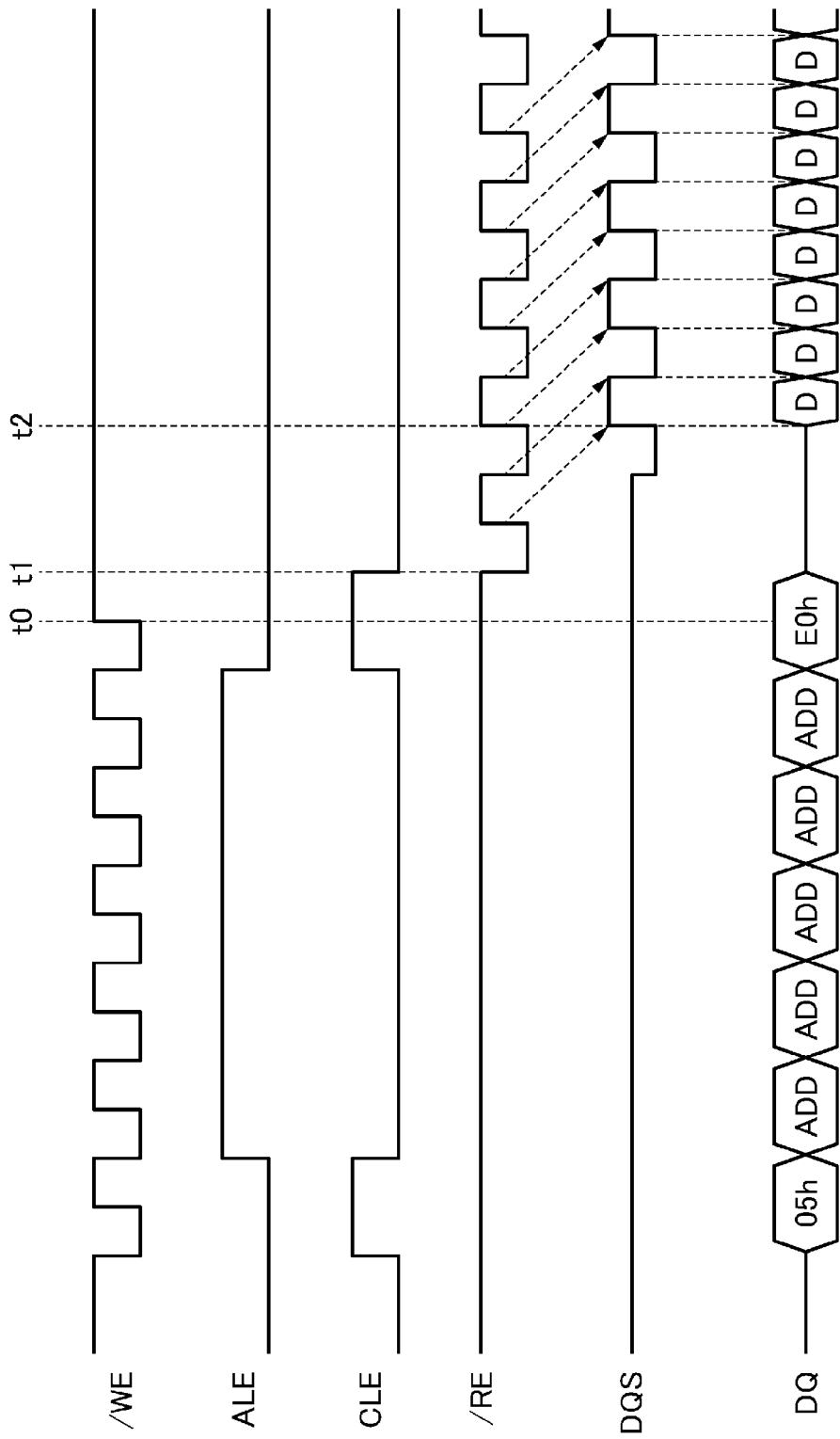
FIG. 10 is a view showing an example of changes in signals communicated between the semiconductor memory device and the memory controller according to the first embodiment.

FIG. 10 shows examples of various signals communicated between the semiconductor memory device 2 and the memory controller 1.

During the read operation, signals including "05h", a plurality of "ADD", and "E0h" are sequentially input from the memory controller 1 toward the semiconductor memory device 2 as the signal DQ <7:0>. "05h" is a command for executing the read operation of data from the memory cell array 110. "ADD" is a signal for designating an address, which is a read source of the data. "E0h" is a command for starting the read operation.

In FIG. 10, the timing at which "E0h" is input to the semiconductor memory device 2 is shown as time to. At time t1 when a certain period has passed since the time t0, the memory controller 1 starts toggling the read enable signal /RE.

As described above, the read enable signal /RE is a signal for the memory controller 1 to read data from the semiconductor memory device 2 and is input to the input/output terminal group 31 of the semiconductor memory device 2. After the time t1, the read enable signal /RE is alternately switched (toggled) between the H level and the L level. Each of the read enable signals /RE, which is switched in this manner, is used as a "read signal" for reading data. The input/output terminal group 31 repeatedly receives a read signal (/RE) from the memory controller 1.

The semiconductor memory device 2 outputs data as the signals DQ <7:0> each time the read enable signal /RE is switched (that is, each time each of the read signals is input) and switches the data strobe signal DQS between the H level and the L level. In FIG. 10, each of the data output as the signals DQ <7:0> is indicated as "D". Further, the timing, at which the first data is output and the data strobe signal DQS is switched, is indicated as time t2. The time from the time t1 to the time t2 is a time lag required for an internal process of the semiconductor memory device 2. A correspondence relationship between switching of the read enable signal /RE input from the memory controller 1 and switching of the data strobe signal DQS output from the semiconductor memory device 2, is indicated by dotted arrows in FIG. 10.

An output of the read data from the semiconductor memory device 2 is performed by dividing one data into even data configured with even number bits and odd data configured with odd number bits, and then outputting each of the even data and odd data alternately. Each of the data indicated as "D" in FIG. 10 is output as either even data or odd data.

Figure 11:
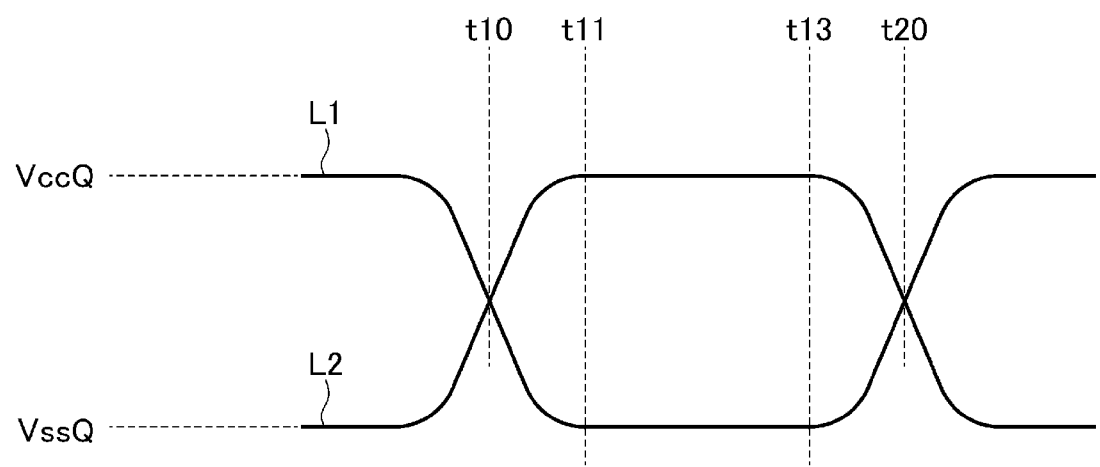
FIG. 11 is a view showing an example of voltage changes in an output pin during a read operation.

When the read data is output, among the power supply input terminal group 33, the voltage of the terminal (pin 501, which will be described later) that outputs the signal DQ is switched each time according to the data. FIG. 11 shows an example of a temporal change in the voltage. As shown in the figure, the voltage of the terminal is set to a voltage of either VccQ or VssQ according to the read data. For example, VccQ is a voltage corresponding to data of "1", and VssQ is a voltage corresponding to data of "0".

The line L1 shows an example where the voltage changes from VccQ to VssQ and then changes back to VccQ. The line L2 shows an example where the voltage changes from VssQ to VccQ and then changes back to VssQ.

Time t10 in FIG. 11 is time when the read data starts to be output from the terminals of the input/output terminal group 31, that is, is time when the voltage of the terminals starts to change according to the read data. The voltage becomes substantially constant at time t11 after the time t10 and is maintained over a constant period of time until time t13. The reading of data by the memory controller 1 is performed, for example, at an intermediate timing during a period from the time t11 to the time t13. At time t20 after the time t13, the next read data starts to be output from the terminals of the input/output terminal group 31.

Figure 12:
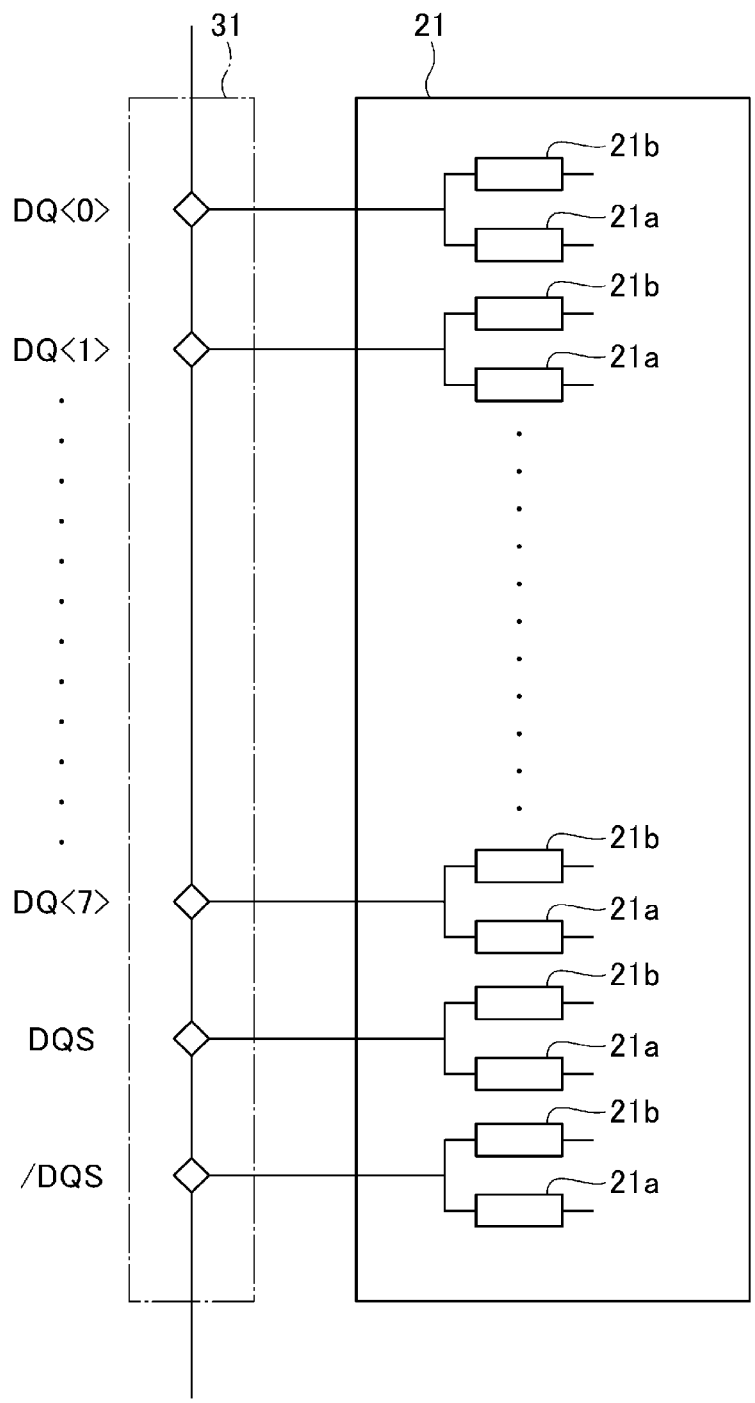
FIG. 12 is a view showing a configuration of an output circuit of the memory system according to the first embodiment.

A specific circuit configuration for executing the output of such read data will be described. FIG. 12 schematically shows an internal configuration of the input/output circuit 21. As shown in the figure, the input/output circuit 21 is provided with an input circuit 21a and an output circuit 21b for each terminal of the input/output terminal group 31. The input circuit 21a is a circuit for acquiring the magnitude of the voltage input to the terminals of the input/output terminal group 31. The output circuit 21b is a circuit for adjusting the magnitude of the voltage output from the terminals of the input/output terminal group 31.

Figure 13:
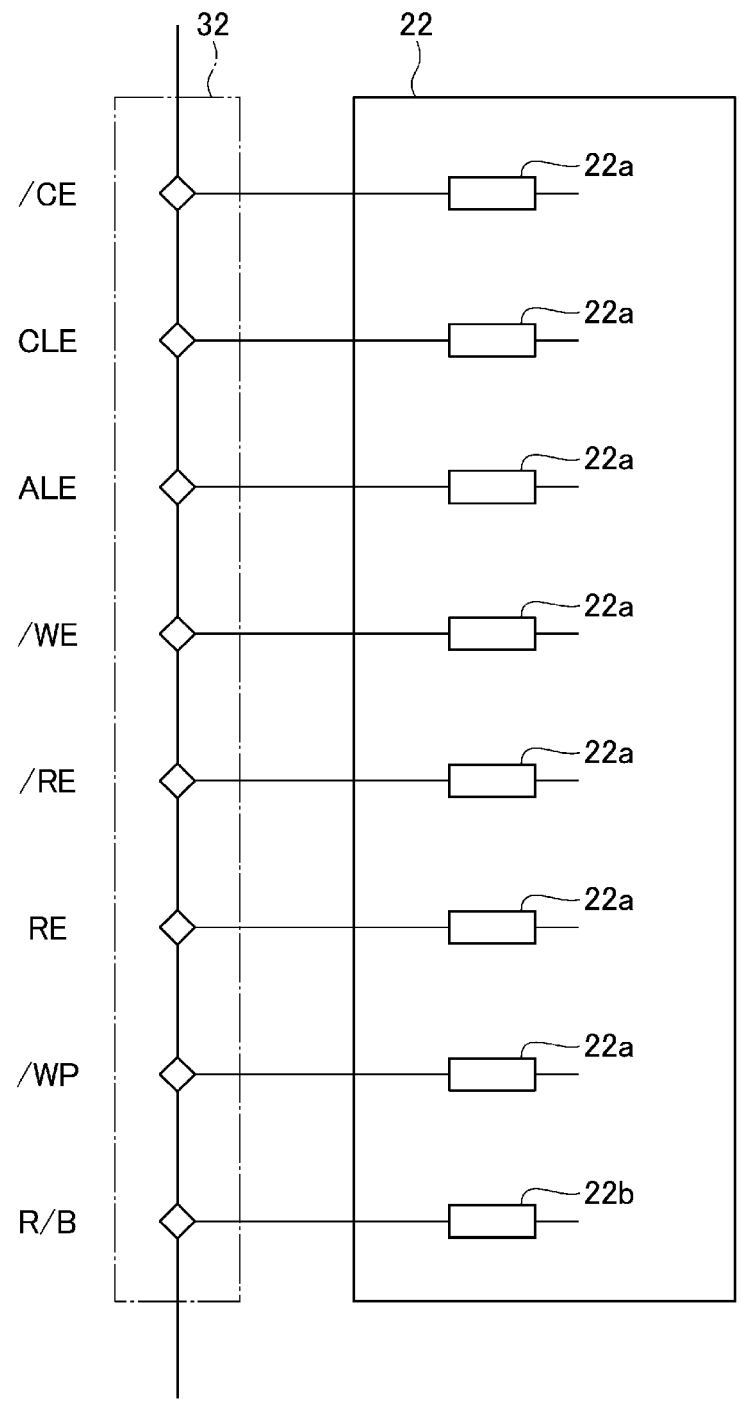
FIG. 13 is a view showing a configuration of a logic control circuit of the memory system according to the first embodiment.

FIG. 13 schematically shows an internal configuration of the logic control circuit 22. As shown in the figure, the logic control circuit 22 is provided with input circuits 22a and an output circuit 22b, and each of the input circuits 22a and the output circuit 22b is connected to one of the terminals of the logic control terminal group 32. Each input circuit 22a is a circuit for acquiring the magnitude of the voltage input to the terminal of the logic control terminal group 32. The output circuit 22b is a circuit for adjusting the magnitude of the voltage output from the terminal of the logic control circuit 22.

Figure 14:
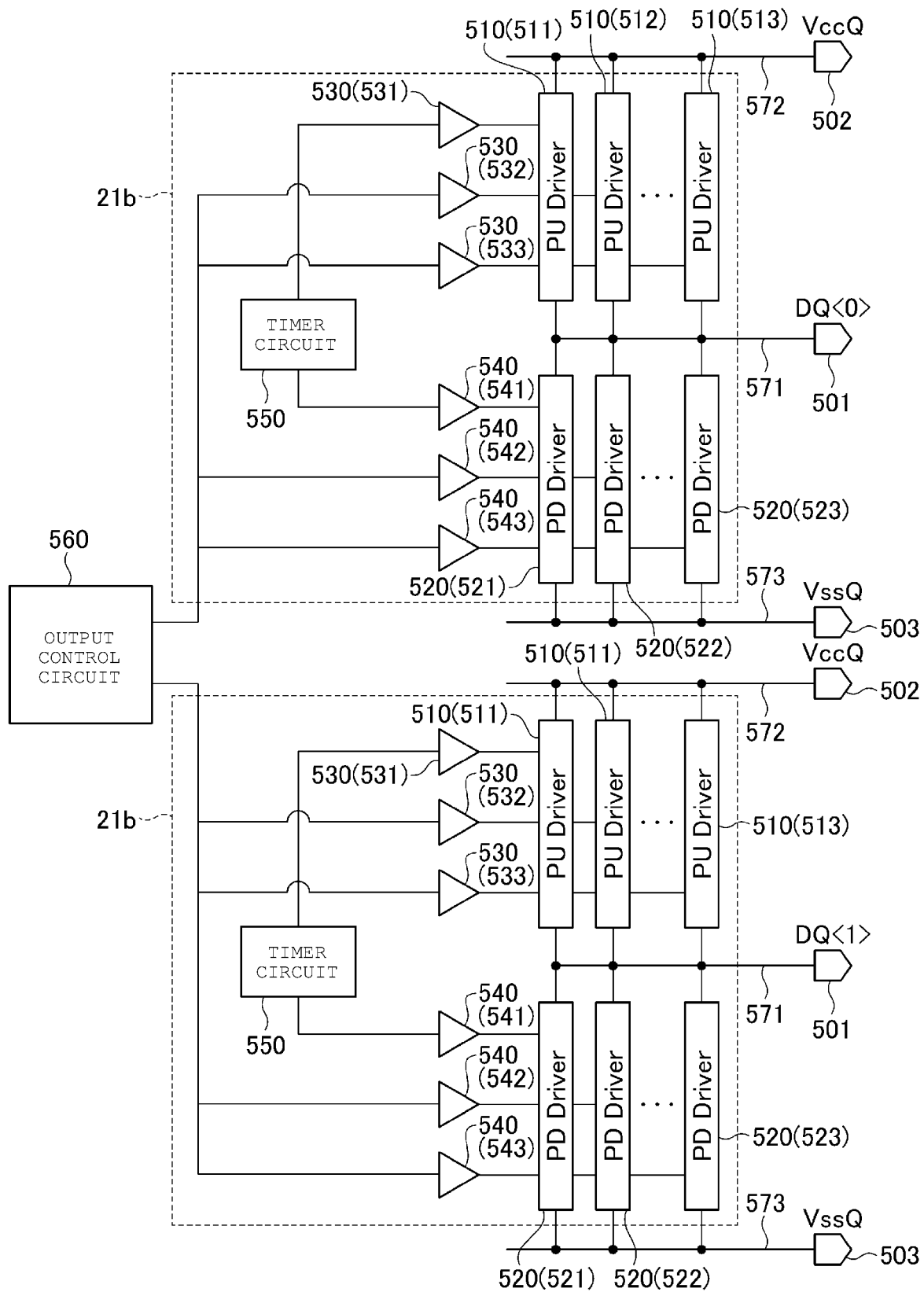
FIG. 14 is a view showing a configuration of the output circuit of the memory system according to the first embodiment.

FIG. 14 shows two pins 501, which are terminals for outputting the signal DQ, among the plurality of terminals in the input/output terminal group 31 and also shows an output circuit 21b corresponding to each of the pins 501. The pin 501 illustrated on the upper side of FIG. 14 is a terminal for outputting the signal DQ <0>. The pin 501 illustrated on the lower side of FIG. 14 is a terminal for outputting the signal DQ <1>.

A circuit for changing the voltage of the pin 501 is substantially the same for each of the pins 501 in the input/output terminal group 31. In the following, the pin 501 for outputting the signal DQ <0> or a peripheral circuit configuration thereof will be mainly described, and a description of other configurations will be omitted as appropriate.

During the read operation, a signal is output from the pin 501 toward the external memory controller 1 corresponding to each of the read data. The "signal" here is an "output signal" output as a voltage that is changed corresponding to each of the read data as shown in FIG. 11. During the read operation, a plurality of read data are continuously output, so the output signal is repeatedly output from the pin 501. During the read operation, each of the pins 501 operates as an "output pin".

One end of a wiring 571 is connected to the pin 501. The wiring 571 is an internal wiring provided in the input/output circuit 21 and is wiring of a circuit for changing the voltage of the pin 501 together with a pull-up driver 510 and the like, which will be described later.

In addition to pin 501, pins 502 and 503 are also shown in FIG. 14. The pin 502 is a terminal among the terminals in the power supply input terminal group 33, to which VccQ is input from the power supply control circuit 3. The pin 503 is a terminal among the terminals in the power supply input terminal group 33, to which VssQ is input from the power supply control circuit 3.

Figure 15:
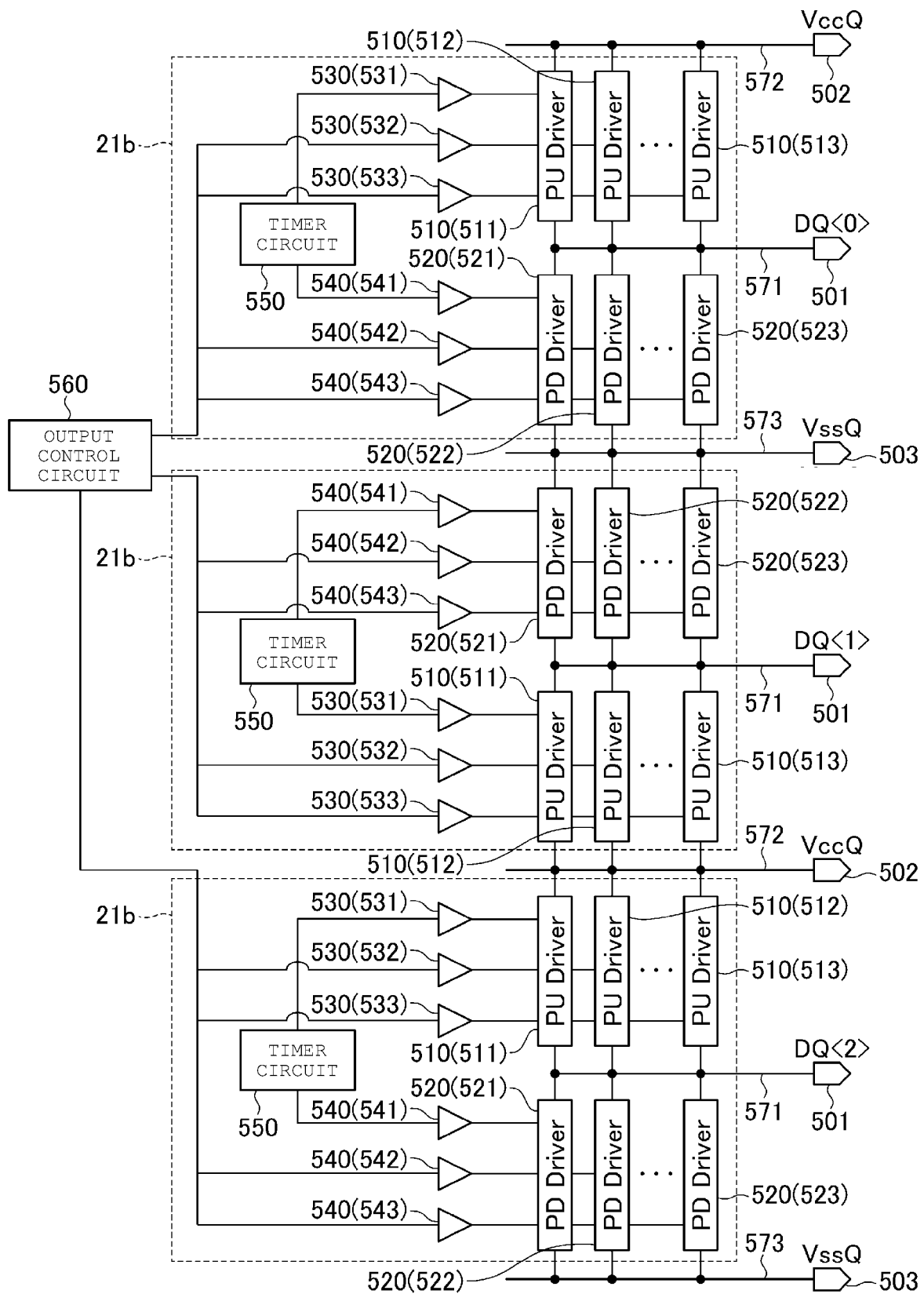
FIG. 15 is a view showing a configuration of the output circuit of the memory system according to a modification example of the first embodiment.

In the example in FIG. 14, the pins 502 and 503 are individually provided corresponding to each of the pins 501. Instead of such a configuration, a configuration in which a pair of pins 501 adjacent to each other may share the pin 502 or pin 503 provided therebetween may be used, as in a modification example shown in FIG. 15. In this modification example, the pin 503 is arranged between the pin 501 for outputting the signal DQ <0> and the pin 501 for outputting the signal DQ <1>. Further, the pin 502 is arranged between the pin 501 for outputting the signal DQ <1> and the pin 501 for outputting the signal DQ <2>.

Returning to FIG. 14, one end of a wiring 571 is connected to the pin 501. Similarly, one end of the wiring 572 is connected to the pin 502 and one end of the wiring 573 is connected to the pin 503. Both the wirings 572 and 573 are internal wirings provided in the input/output circuit 21 and are maintained at a predetermined voltage by an input from the power supply control circuit 3. That is, a voltage of the wiring 572 is maintained at VccQ, and a voltage of the wiring 573 is maintained at VssQ. The wirings 572 and 573 correspond to "reference voltage lines" in the present embodiment.

A circuit (input/output circuit 21), which is connected to the pin 501, includes a pull-up driver 510, a pull-down driver 520, drive circuits 530 and 540, a timer circuit 550, and an output control circuit 560. A part of these may be provided outside the input/output circuit 21.

The pull-up driver 510 is a circuit for pulling up the voltage of the pin 501 to VccQ. The pull-up driver 510 includes a p-channel MOS transistor provided between the wiring 572 and the wiring 571. A drive circuit 530, which will be described later, adjusts a resistance value of the p-channel MOS transistor, whereby the voltage of the pin 501 is pulled up.

A plurality of pull-up drivers 510 are provided and arranged in parallel between the wiring 572 and the wiring 571. In FIG. 14, only three pull-up drivers 510 (511, 512, 513) are shown among the plurality of pull-up drivers, and an illustration of the other pull-up drivers 510 is omitted.

When the voltage of the pin 501 is pulled up to VccQ, the predetermined number of pull-up drivers 510 are turned on during an output period of data. The "predetermined number" referred to herein is a number that is set in advance according to, for example, the ambient temperature such that the electric resistance between the wiring 572 and the wiring 571 becomes a predetermined standard value.

Each of the pull-up drivers 510 is maintained in a constant state of ON or OFF during the output period of data, but in the present embodiment, one pull-up driver 511 operates differently from the above. In other words, the adjustment of the electric resistance in accordance with the standard value is performed by the pull-up drivers 510 other than the pull-up driver 511. An operation or a purpose of the pull-up driver 511 will be described later.

The drive circuit 530 is a circuit for controlling the operation of the p-channel MOS transistor in the pull-up driver 510. The drive circuit 530 changes the electric resistance of the pull-up driver 510 by transmitting a control signal to a gate of the p-channel MOS transistor. A plurality of drive circuits 530 are provided corresponding to each of the pull-up drivers 510. In the example in FIG. 14, a drive circuit 531 is provided corresponding to the pull-up driver 511, a drive circuit 532 is provided corresponding to the pull-up driver 512, and a drive circuit 533 is provided corresponding to the pull-up driver 513. The drive circuits 530 are provided in the same number as the pull-up drivers 510, but only three drive circuits 530 are shown in FIG. 14.

An operation of each of the drive circuits 530 is controlled by an output control circuit 560 which will be described later. It is noted that the drive circuit 531 is not directly controlled by the output control circuit 560 but is controlled by a timer circuit 550 which will be described later.

The pull-down driver 520 is a circuit for pulling down the voltage of the pin 501 to VssQ. The pull-down driver 520 includes an n-channel MOS transistor provided between the wiring 573 and the wiring 571. A drive circuit 530, which will be described later, adjusts a resistance value of the n-channel MOS transistor, whereby the voltage of the pin 501 is pulled down.

A plurality of pull-down drivers 520 are provided and arranged in parallel between the wiring 573 and the wiring 571. In FIG. 14, only three pull-down drivers 520 (521, 522, 523) are shown among the plurality of pull-down drivers, and an illustration of the other pull-down drivers 520 is omitted.

When the voltage of the pin 501 is pulled down to VssQ, the predetermined number of pull-down drivers 520 are turned on during the output period of data. The "predetermined number" referred to here is a number that is set in advance according to, for example, the ambient temperature such that the electric resistance between the wiring 573 and the wiring 571 becomes a predetermined standard value.

Each of the pull-down drivers 520 is maintained in a constant state of ON or OFF during the output period of data, but in the present embodiment, one pull-down driver 521 operates differently from the above. In other words, the adjustment of the electric resistance in accordance with the standard value is performed by pull-down drivers 520 other than the pull-down driver 521. An operation or a purpose of the pull-down driver 521 will be described later.

The drive circuit 540 is a circuit for controlling the operation of the n-channel MOS transistor in the pull-down driver 520. The drive circuit 540 changes the electric resistance of the pull-down driver 520 by transmitting a control signal to a gate of the n-channel MOS transistor. A plurality of drive circuits 540 are provided corresponding to each of the pull-down drivers 520. In the example in FIG. 14, a drive circuit 541 is provided corresponding to the pull-down driver 521, a drive circuit 542 is provided corresponding to the pull-down driver 522, and a drive circuit 543 is provided corresponding to the pull-down driver 523. The drive circuits 540 are provided in the same number as the pull-down drivers 520, but only three drive circuits 540 are shown in FIG. 14.

An operation of each of the drive circuits 540 is controlled by an output control circuit 560 which will be described later. It is noted that the drive circuit 541 is not directly controlled by the output control circuit 560 but is controlled by a timer circuit 550 which will be described later.

When pulling up the voltage of the pin 501 according to the data to be output, the predetermined number of pull-up drivers 510 are turned on, and the pull-down drivers 520 are maintained to be turned off. When pulling down the voltage of the pin 501 according to the data to be output, the predetermined number of pull-down drivers 520 are turned on, and the pull-up drivers 510 are maintained to be turned off. As described above, the pull-up driver 510 and the pull-down driver 520 operate independently.

The timer circuit 550 is a circuit that controls operations of the drive circuits 531 and 541. While measuring the elapsed time, the timer circuit 550 controls the drive circuit 531 such that the pull-up driver 511 is turned on for a predetermined time set in advance. Alternatively, while measuring the elapsed time, the timer circuit 550 controls the drive circuit 541 such that the pull-down driver 521 is turned on for the predetermined time set in advance. Only one of the pull-up driver 511 or the pull-down driver 521 is turned on by the timer circuit 550. The timing or time when the pull-up driver 511 and the like are turned on is adjusted by the timer circuit 550. The purpose thereof will be described later.

The output control circuit 560 is a circuit for individually controlling the operation of the pull-up driver 510, the pull-down driver 520, or the like such that the voltage of the pin 501 becomes the voltage corresponding to the read data. In FIG. 1, although lines extending from a plurality of drive circuits 530 and 540 are illustrated such that the lines are connected to the output control circuit 560 as a group, in practice, lines connecting the output control circuit 560 to each of the drive circuits 530 and 540 are provided individually. In the present embodiment, the output control circuit 560 is provided as a part of the sequencer 41. It is noted that a function of the output control circuit 560, which will be described later, may be implemented by a circuit provided separately from the sequencer 41.

The pull-up driver 510, the pull-down driver 520, and the drive circuits 530 and 540 constitute an "output circuit" for changing the voltage of the pin 501 in response to the signal to be output as the read data. The output control circuit 560 corresponds to a "control unit" that controls an operation of the output circuit.

The capability of the output circuit to change the voltage of the pin 501 per unit time is defined here as a "drive capability". As the number of pull-up drivers 510 or pull-down drivers 520 that are turned on when data is output increases, the drive capability of the output circuit increases. The output control circuit 560 adjusts the number of operations of the pull-up driver 510 according to the temperature or the like such that the drive capability of the output circuit satisfies the standard value.

Incidentally, when the read data is output, adjustment of the voltage is performed simultaneously for each of the plurality of pins 501. Therefore, a non-negligible amount of current flows through the pins 502 and 503 according to the total number of the pins 501, and as a result, the voltage of the pin 502 fluctuates so as to deviate from the reference voltage VccQ. Similarly, the voltage of the pin 503 fluctuates so as to deviate from the reference voltage VssQ. Such voltage fluctuation occurs because there is an inductance element (not shown) inside the power supply control circuit 3 connected to the pin 502 or the pin 503. Noise, which is generated as a result of the voltage fluctuation of the pin 503 or the like, is widely known as "simultaneous switching noise".

Figure 16:
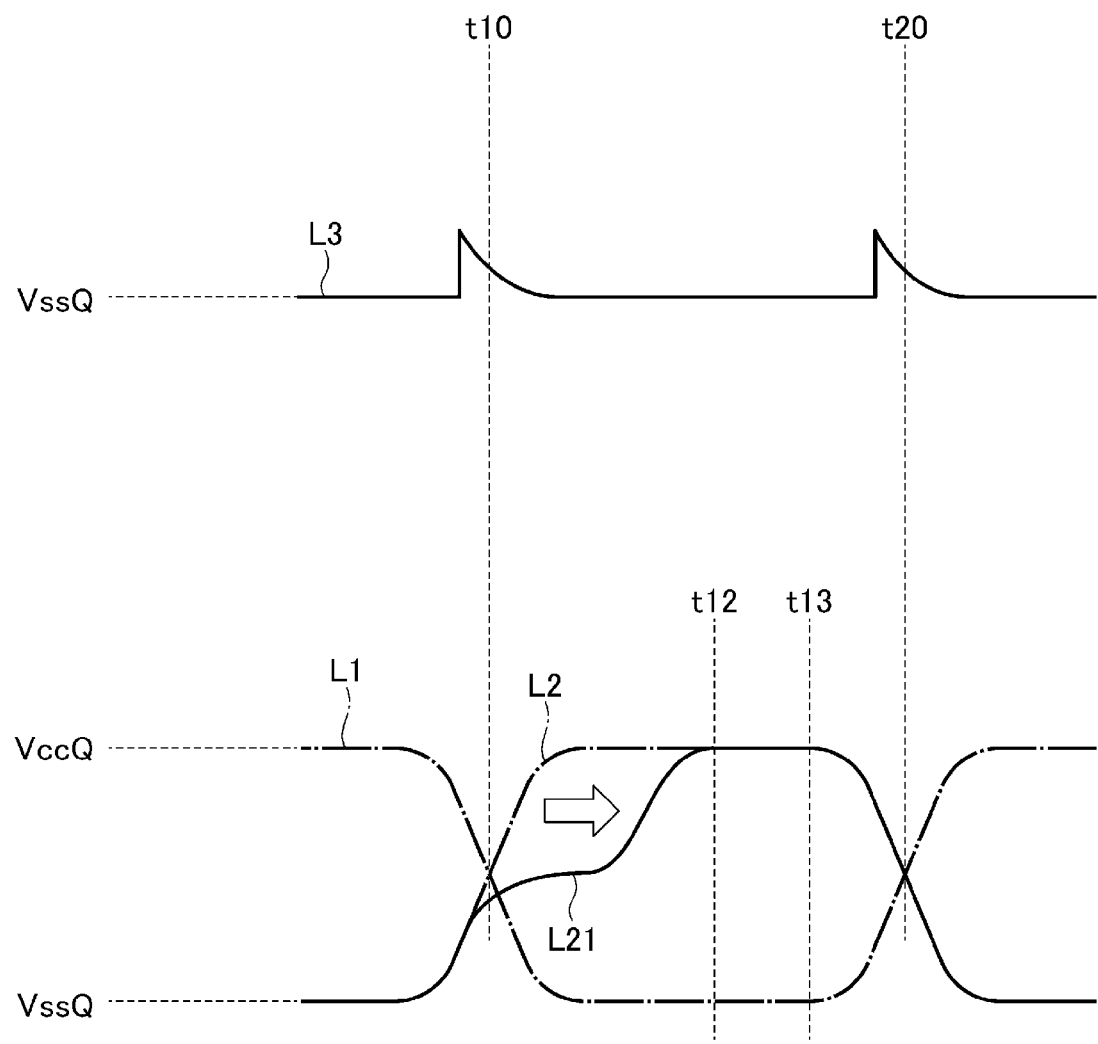
FIGS. 16-18 each show an example of changes in signals communicated between the semiconductor memory device and the memory controller according to the first embodiment.

A line L3 shown in the upper part in FIG. 16 is an example of a temporal change in the voltage of the pin 503 when the above-described voltage fluctuation occurs with the output of the read data. The voltage fluctuation of the pin 503 occurs at each of the timings (time t10, t20, or the vicinity thereof) at which the read data is output. The same applies to the pin 502.

When the voltage of the pin 502 or the pin 503 deviates from the reference voltage, the operation of the pull-up driver 510 or the pull-down driver 520 changes due to the influence of the voltage fluctuations of the wiring 572 or the wiring 573. Further, the operations of the drive circuits 530 and 540 may change. Furthermore, the output data itself (that is, a voltage difference between the pin 501 and the pin 503) changes as the reference voltage changes.

Lines L1 and L2 shown in the lower part in FIG. 16 are identical to lines L1 and L2 in FIG. 11, respectively, and represent normal waveforms in which the above-described voltage fluctuation does not occur. A line L21 is an example of a temporal change in the voltage of the pin 501 when the influence of the voltage fluctuation shown in L3 in the upper part is received. In this example, a waveform of the signal output from the pin 501 changes from the line L2 to the line L21 due to the influence of the voltage fluctuation of the pin 503. In the line L21, a speed of increase in voltage after the time t10 is decreased as compared with the line L2. In other words, the drive capability of the output circuit is lower than normally.

In the example of the line L21, the voltage of the pin 501 becomes substantially constant at time t12 after the time t10 and is maintained over a constant period of time until time t13. The length of the period during which the voltage is constant is shorter than as shown in FIG. 11 (the period from time t11 to time t13). Therefore, depending on the timing at which data read is performed by the memory controller 1, the data may not be read correctly.

The voltage fluctuation of the pin 503 or the like as indicated by the line L3 increases according to the number of the pins 501 or the speed of change in the voltage of the pin 501. In other words, as the transfer speed of data output from the semiconductor memory device 2 increases, the voltage fluctuation of the pin 503 or the like also increases.

In recent years, the semiconductor memory device 2 is required to have a higher speed, and it is expected that a higher data transfer speed will be required in the future. However, when the data transfer speed increases, the influence of simultaneous switching noise in the pin 503 or the like cannot be ignored as described above, so there is a probability that it will be difficult to meet the demand for the data transfer speed.

Therefore, in the semiconductor memory device 2 according to the present embodiment, the output control circuit 560 is intended to reduce the influence of simultaneous switching noise by performing a process of temporarily changing the drive capability of the output circuit. The process is hereinafter also referred to as a "capability adjustment process".

Figure 17:
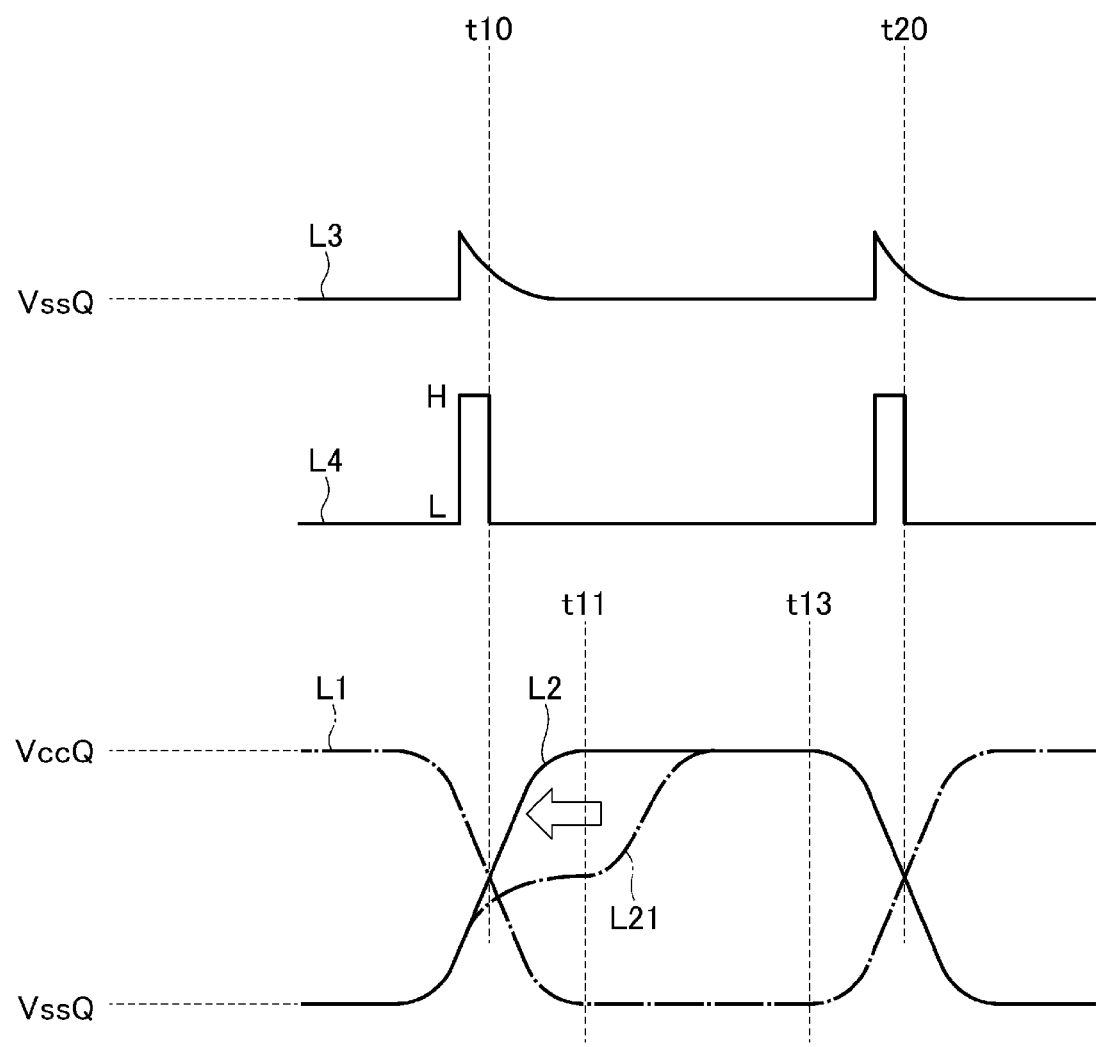

The capability adjustment process will be described with reference to FIG. 17. The waveforms of lines L1, L2, L3 and line L21 shown in FIG. 17 are all identical to those shown in FIG. 16. A line L4, which is newly shown in FIG. 17, is a waveform of the control signal transmitted from the timer circuit 550 to the drive circuit 531. The waveform changes from L to H just before the timing (time t10) at which the output of the read data is started, and is maintained at H for a predetermined time until time t10. Thereafter, the waveform changes from H to L at the time t10.

The process of switching the control signal from the timer circuit 550 from L to H is performed by the output control circuit 560. Thereafter, the timer circuit 550 measures the elapsed time from the timing and returns the control signal from H to L at the timing when the "predetermined time" has passed. The "predetermined time" may be fixed time set in advance or may be a variable time set by the output control circuit 560 each time.

When the above control signal is L, the drive circuit 531 turns off the pull-up driver 511. On the other hand, while the control signal is H, the drive circuit 531 turns on the pull-up driver 511 in this example. As a result, the electric resistance between the wiring 571 and the wiring 572 is decreased, so that the speed of increase in the voltage of the wiring 571 and the pin 501 is temporarily increased. In other words, the drive capability of the output circuit is temporarily increased.

Therefore, even in a state where the voltage fluctuation of the pin 503 occurs as shown by the line L3, the speed, at which the voltage of the pin 501 rises toward VccQ, increases for a while after the control signal becomes H. As a result, the voltage of the pin 501 changes like the line L2 rather than the line L21. That is, a change is made in the same manner as when no voltage fluctuation occurs.

The capability adjustment process as described above is performed in parallel for all the respective pins 501 provided in the input/output terminal group 31. Further, the capability adjustment process is performed in each of the plurality of semiconductor memory devices 2 provided in the memory system in FIG. 2. The waveform shown by line L4 in FIG. 17, that is, the waveform of the control signal transmitted from the timer circuit 550 to the drive circuit 531 can be different for each of the semiconductor memory devices 2, and can be different for each of the pins 501 in one semiconductor memory device 2.

Further, the waveform of the voltage fluctuation such as the line L3 also changes depending on the read data (for example, 8-bit data) output from the entire input/output terminal group 31. Therefore, the timing for transmitting the control signal from each of the timer circuits 550, the waveform of the control signal, or the like may be appropriately adjusted according to the read data. A correspondence relationship between the read data and the control signal to be output from the timer circuit 550 may be stored in, for example, a ROM (not shown) which is provided in the semiconductor memory device 2.

The waveform of the voltage fluctuation of the pin 503 caused by the influence of simultaneous switching noise may differ from the waveform shown by line L3 in FIG. 17. For example, the waveform may be such that it temporarily shifts from VssQ to the negative voltage side. In that case, the influence on the voltage of the pin 501 is different from that in FIG. 17, and the waveform of the control signal to be output from the timer circuit 550 also becomes different.

Further, even when the waveform of the voltage fluctuation of the pin 503 is a waveform that temporarily shifts to the positive voltage side like the line L3, depending on its magnitude, or the like the degree of influence on the drive circuit 530 may change, and the influence on the voltage of the pin 501 may be different from the example in FIG. 17. It is preferable to measure in advance by experiment or the like what kind of waveform signal should be output as the control signal.

Figure 18:
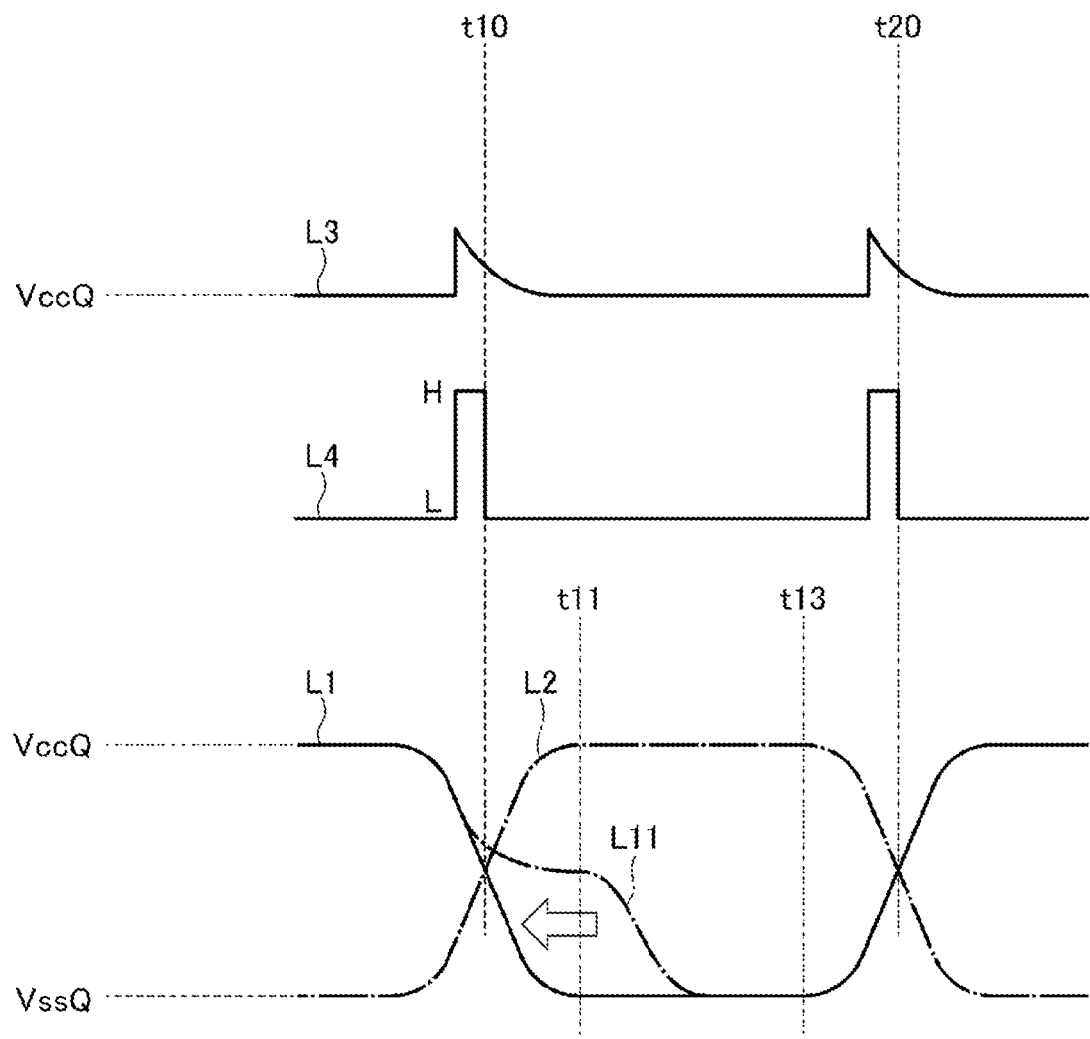

As shown in FIG. 18, the waveform of line L1 may change to that of line L11 due to the influence of the simultaneous switching noise. In the line L11, a speed of decrease in voltage after the time t10 is decreased as compared with the line L1. In other words, the drive capability of the output circuit is lower than normally. In this case, a control signal having a waveform indicated by line L4 may be transmitted from the timer circuit 550 to the drive circuit 541. As a result, the waveform of the line L11 can be brought closer to the normal waveform like the line L1.

Further, depending on the influence of the simultaneous switching noise, in some cases, it may be better to temporarily reduce the drive capability of the output circuit. In this case, a process of turning off a driver, which should be turned on with data output among the pull-up driver 510 or the pull-down driver 520, only for a constant period after the start of data output may be performed as the capability adjustment process.

As described above, the output control circuit 560, which is a control unit, performs the capability adjustment process to temporarily change the drive capability of the output circuit when each of the signals corresponding to each read data is output from the pin 501. As a result, it is possible to reduce the influence of simultaneous switching noise and to stably output the read data at high speed. The term "temporarily" means that it is not over the entire output period of the read data.

The timing at which the control signal from the timer circuit 550 changes from L to H may be a timing slightly before the time t10 as in the present embodiment, may be the same timing as the time t10, and may be a timing slightly later than the time t10. In any case, the timing at which the control signal from the timer circuit 550 changes from L to H is preferably set based on the timing at which the signal of the read data is output toward the memory controller 1. That is, it is preferable to set the timing offset by a predetermined time (including 0) from the timing at which the signal of the read data is output. The "timing at which the signal of the read data is output" refers to the time t10 in the example in FIG. 17 and the time t2 in the example in FIG. 10.

The timing, at which a process of outputting the read data is internally started, is a timing earlier than the time t2 in FIG. 10, and specifically is a timing (time t1) at which the read enable signal /RE is input from the memory controller 1. Therefore, the timing, at which the internal process for changing the control signal from L to H is started, is a timing based on the timing at which the read enable signal /RE is input from the memory controller 1 (time t1).

As described above, the output control circuit 560 of the present embodiment performs the capability adjustment process from a predetermined timing, which is based on the timing (for example, time t10) at which the signal of the read data is output toward the memory controller 1, until a predetermined time, which is set in advance, elapses. Further, by providing the timer circuit 550 for measuring the "predetermined time", it is possible to appropriately and reliably execute the capability adjustment process.

The influence of the simultaneous switching noise often occurs in the first half of the period when the read data is output, as in the example in FIG. 17. Therefore, the timing at which the control signal is returned from H to L, that is, the timing at which the capability adjustment process ends is preferably the first half of the period from when the signal of the read data starts to be output at the time t10 until the output of the signal is completed at the time t20.

As described above, the "output circuit" for changing the voltage of the pin 501 includes: the pull-up driver 510 that changes the electric resistance between the wiring 572, which is a reference voltage line, and the pin 501; the pull-down driver 520 that changes the electric resistance between the wiring 573, which is a reference voltage line, and the pin 501; and the drive circuits 530 and 540 for driving the pull-up driver 510 and the pull-down driver 520. The output control circuit 560, which is the control unit, performs the capability adjustment process by controlling the operations of the drive circuits 530 and 540.

The pull-up driver 510, the pull-down driver 520, or the like is provided in advance in the semiconductor memory device 2 as a circuit for matching the electric resistance between the wiring 572 and the wiring 571 to the standard value. Therefore, in the semiconductor memory device 2 according to the present embodiment, it is possible to execute the capability adjustment process while effectively using a part of the existing configuration provided as the output circuit.

As shown in FIG. 14, a plurality of sets of pull-up drivers 510 and drive circuits 530 are provided, and a plurality of sets of pull-down drivers 520 and drive circuits 540 are also provided. The output control circuit 560 performs the capability adjustment process by controlling the operation of a part of the drive circuits 530 and 540 among the plurality of drive circuits 530 and 540. The "a part of the drive circuits 530 and 540" are dedicated drive circuits 531 and 541 provided for executing the capability adjustment process in the present embodiment. In other words, when the capability adjustment process is unnecessary, both the drive circuits 531 and 541 are always kept off.

A change in the output waveform due to the influence of the simultaneous switching noise may occur not only at the pin 501 for outputting DQ <0> or the like but also at a pin for outputting the data strobe signal DQS. Therefore, the configuration described above and the capability adjustment process can also be applied to the pin for outputting the data strobe signal DQS. This pin also corresponds to an "output pin" that repeatedly outputs an output signal (DQS) to the external memory controller 1. A configuration for executing the capability adjustment process for the output from the pin is substantially the same as the configuration around the pin 501 shown in FIG. 14, so specific illustration and description thereof will be omitted.

A second embodiment will be described. In the following, points different from the first embodiment will be mainly described, and descriptions of points common to the first embodiment will be omitted as appropriate.

Figure 19:
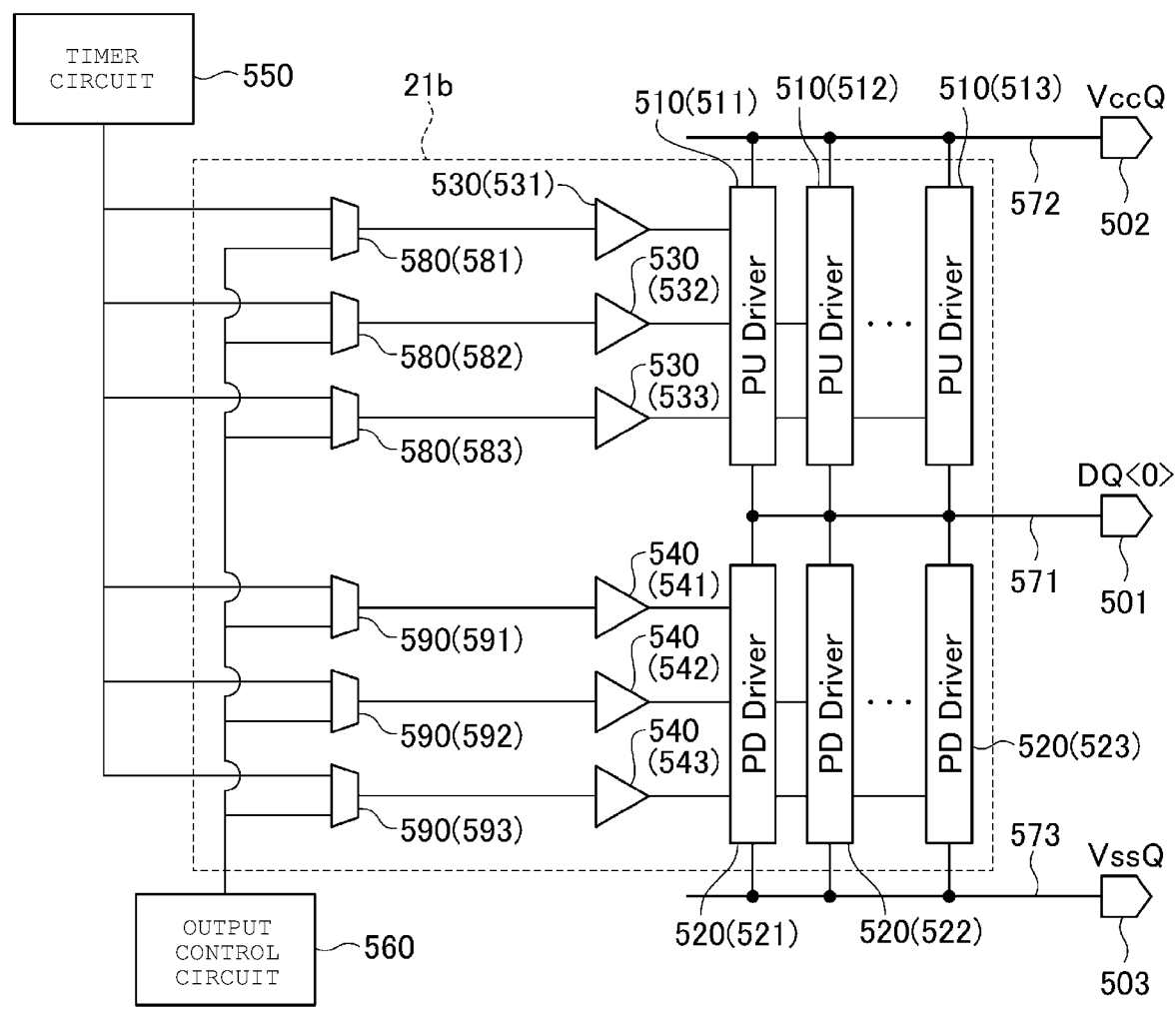
FIG. 19 is a view showing a configuration of an output circuit of a semiconductor memory device according to a second embodiment.

FIG. 19 shows a configuration of the pin 501 and the periphery thereof in the present embodiment. The illustrated pin 501 is a terminal for outputting the signal DQ <0>. Other pins 501 for outputting the signal DQ <1> and the like are not shown, but the other pins 501 also have the same configuration as in FIG. 19.

In the first embodiment in FIG. 14, a part of the plurality of drive circuits 530 (e.g., drive circuits 531) is configured to be directly controlled by the timer circuit 550, and the others are directly controlled by the output control circuit 560. Similarly, a part of the plurality of drive circuits 540 (e.g., drive circuits 541) is configured to be directly controlled by the timer circuit 550, and the others are directly controlled by the output control circuit 560.

In contrast, in the present embodiment in FIG. 19, all of the plurality of drive circuits 530 and 540 are configured to be directly controlled by either the timer circuit 550 or the output control circuit 560. In order to achieve this, a multiplexer 580 is provided for each of the plurality of drive circuits 530 in the present embodiment. Further, a multiplexer 590 is provided corresponding to each of the plurality of drive circuits 540.

The number of multiplexers 580 is the same as the number of drive circuits 530. FIG. 19 shows a multiplexer 581 connected to the drive circuit 531, a multiplexer 582 connected to the drive circuit 532, and a multiplexer 583 connected to the drive circuit 533 among the plurality of multiplexers 580, and the illustration of other multiplexers 580 is omitted.

Similarly, the number of multiplexers 590 is the same as the number of drive circuits 540. FIG. 19 shows a multiplexer 591 connected to the drive circuit 541, a multiplexer 592 connected to the drive circuit 542, and a multiplexer 593 connected to the drive circuit 543 among the plurality of multiplexers 590, and the illustration of other multiplexers 590 is omitted.

Both the control signal from the timer circuit 550 and the control signal from the output control circuit 560 are input to each of the multiplexers 580. One of these control signals is input to the drive circuit 530 and used to control the operation of the pull-up driver 510 connected thereto. Which control signal is input to the drive circuit 530 is determined by, for example, a signal input from the sequencer 41 to the multiplexer 580.

Similarly, both the control signal from the timer circuit 550 and the control signal from the output control circuit 560 are input to each of the multiplexers 590. One of these control signals is input to the drive circuit 540 and used to control the operation of the pull-down driver 520 connected thereto. Which control signal is input to the drive circuit 540 is determined by, for example, a signal input from the sequencer 41 to the multiplexer 590.

In the present embodiment, as in the first embodiment, only a part of the plurality of pull-up drivers 510 or the plurality of pull-down drivers 520 are used for the capability adjustment process, and are temporarily turned on when the read data is output. It is noted that which pull-up driver 510 or the like is used for the capability adjustment process is not fixed in the present embodiment.

As described above, during the period in which the read data is output from the pin 501 (period from time t10 to time t20), the predetermined number of pull-up drivers 510 and the like are turned on (during the entire period) such that the electric resistance between the wiring 572 and the wiring 571 becomes a predetermined standard value. The "predetermined number" is adjusted each time according to, for example, the ambient temperature.

In the present embodiment, the pull-up drivers 510 and the like excluded from the above-mentioned "predetermined number" are used for the capability adjustment process. In such a configuration, there is no need to provide a dedicated pull-up driver 510 or the like or a drive circuit 530 or the like for the capability adjustment process, so the number of pull-up drivers 510 or the like in the semiconductor memory device 2 can be reduced. Even with such a configuration, the same effects as those described in the first embodiment can be obtained.

A third embodiment will be described. In the following, points different from the second embodiment will be mainly described, and descriptions of points common to the second embodiment will be omitted as appropriate.

The configuration of the semiconductor memory device 2 in the present embodiment is the same as that of the second embodiment shown in FIG. 19. The present embodiment differs from the second embodiment in the content of processes executed by the output control circuit 560 and the like.

Figure 20:
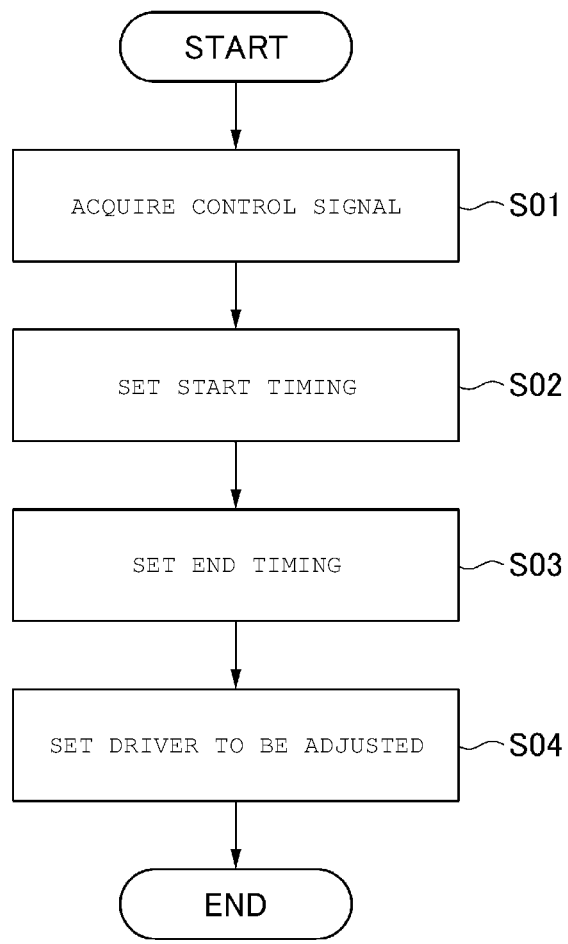
FIG. 20 is a flow chart showing a flow of processing executed by a sequencer in a semiconductor memory device according to a third embodiment.

A series of processes shown in FIG. 20 are executed by the output control circuit 560 of the present embodiment prior to performing the capability adjustment process. The process is started at a time point when a predetermined command for starting a SetFeature function is input from the memory controller 1 to the semiconductor memory device 2. The command is a command for configuring the capability adjustment process by using various parameters.

The control signal indicating various parameters is input from the memory controller 1 together with the above command. In the first step S01, a process of acquiring the control signal is performed.

In step S02 following step S01, a process of setting the start timing of the capability adjustment process is performed as one of the parameters of the capability adjustment process. The "start timing of the capability adjustment process" is, for example, a timing at which the control signal, which is transmitted from the timer circuit 550 to the drive circuit 531, is switched from L to H as indicated by line L4 in FIG. 17. A parameter indicating the start timing of the capability adjustment process can be set as, for example, offset time based on an output start time point of the data (time t10). Such parameters are stored in advance in, for example, a feature register in the sequencer 41, and one of the parameters is selected and set by the control signal from the memory controller 1.

In step S03 following step S02, a process of setting an end timing of the capability adjustment process is performed as another parameter of the capability adjustment process. The "end timing of the capability adjustment process" is, for example, a timing at which the control signal, which is transmitted from the timer circuit 550 to the drive circuit 531, returns from H to L as indicated by line L4 in FIG. 17. The parameter set in step S03 may be set as the length of time for which the control signal from the timer circuit 550 is maintained at H. The parameters are stored in advance in the feature register in the sequencer 41, and one of the parameters is selected and set by the control signal from the memory controller 1.

In step S04 following step S03, a process of setting the pull-up driver 510 or the pull-down driver 520 used in the capability adjustment process is performed as another parameter of the capability adjustment process. During the period when the control signal from the timer circuit 550 is H, the pull-up driver 510 or the like set here is temporarily turned on. For example, when it is necessary to significantly improve the drive capability of the output circuit, a large number of pull-up drivers 510 are set for use in the capability adjustment process. The parameters are stored in advance in the feature register in the sequencer 41, and one of the parameters is selected and set by the control signal from the memory controller 1.

How the parameters for the capability adjustment process should be set differs depending on a location where the semiconductor memory device 2 is provided, the wiring length from the semiconductor memory device 2 to the memory controller 1, or the like. Therefore, in the present embodiment, the parameters for the capability adjustment process are not always set constant, but are set based on the control signal input from the memory controller 1. Accordingly, it is possible to execute the capability adjustment process by using appropriate parameters according to the location of the semiconductor memory device 2 and the like. A parameter, which is set according to the control signal, may be a different type of parameter from the above.

A fourth embodiment will be described. In the following, points different from the second embodiment (FIG. 19) will be mainly described, and descriptions of points common to the second embodiment will be omitted as appropriate.

Figure 21:
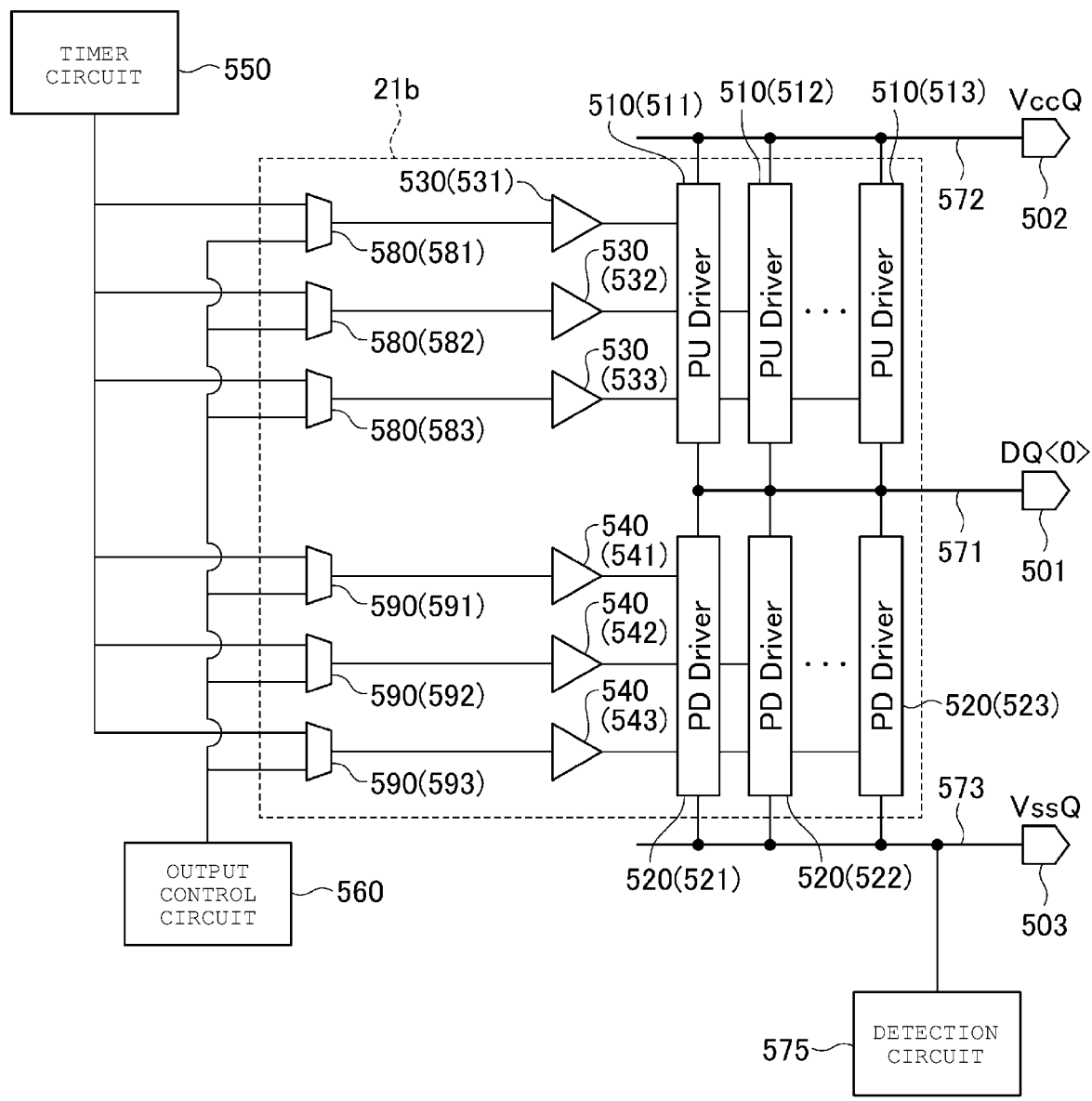
FIG. 21 is a view showing a configuration of an output circuit of a semiconductor memory device according to a fourth embodiment.

FIG. 21 shows a configuration of the semiconductor memory device 2 in the present embodiment. As is clear from comparison with FIG. 19, the present embodiment differs from the second embodiment in that a detection circuit 575 is provided in the wiring 573.

The detection circuit 575 is a circuit for detecting the voltage of the wiring 573 which is the reference voltage line. The voltage of the wiring 573 is detected by the detection circuit 575 each time a predetermined control period elapses and transmitted to the output control circuit 560. Therefore, the output control circuit 560 can sample waveforms of the voltage of the wiring 573.

Figure 22:
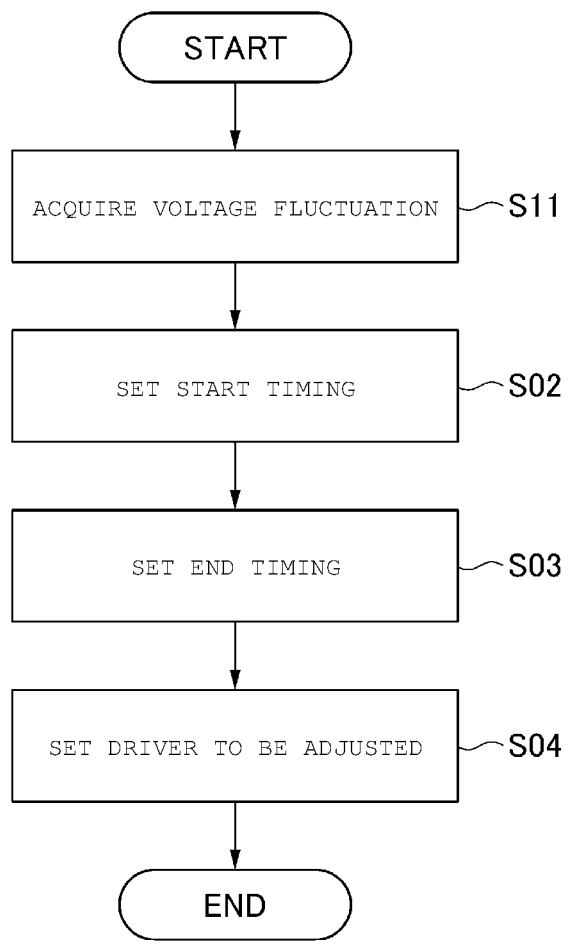
FIG. 22 is a flow chart showing a flow of processing executed by a sequencer in the semiconductor memory device according to the fourth embodiment.

A series of processes shown in FIG. 22 are executed by the output control circuit 560 of the present embodiment prior to performing the capability adjustment process. Among each of the steps shown in FIG. 22, the same steps as in FIG. 20 are assigned the same reference numerals (S02 or the like) as in FIG. 20. A series of processes shown in FIG. 22 is started, for example, at a timing when a peak value of voltage fluctuation of the wiring 573 exceeds a predetermined value.

In the first step S11, a process of acquiring a waveform of the voltage fluctuation occurring in the wiring 573 is performed. In step S11, among the sampled waveforms of the voltage of the wiring 573, a waveform of a portion including a period in which the voltage fluctuation occurs is acquired, and a peak value of the waveform and the like are analyzed.

In step S02 following step S11, similar to step S02 in FIG. 20, a process of setting the start timing of the capability adjustment process is performed as one of the parameters of the capability adjustment process. It is noted that here, the start timing of the capability adjustment process is set not based on the control signal from the memory controller 1 but based on the waveform of the voltage fluctuation acquired in step S11. For example, the timing at which the voltage fluctuation reaches the peak value or the timing offset from the timing by a predetermined time is set as the start timing of the capability adjustment process.

In step S03 following step S02, similar to step S03 in FIG. 20, a process of setting an end timing of the capability adjustment process is performed as another parameter of the capability adjustment process. Further, the end timing of the capability adjustment process is set not based on the control signal from the memory controller 1 but based on the waveform of the voltage fluctuation acquired in step S11. For example, the end timing of the capability adjustment process is set such that the larger the peak value of the voltage fluctuation, the longer the execution time (time during which the control signal from the timer circuit 550 is H) of the capability adjustment process.

In step S04 following step S03, similar to step S04 in FIG. 20, a process of setting the pull-up driver 510 or the pull-down driver 520 used in the capability adjustment process is performed as another parameter of the capability adjustment process. Further, the pull-up driver 510 or the like, which is used in the capability adjustment process, is set not based on the control signal from the memory controller 1 but based on the waveform of the voltage fluctuation acquired in step S11. For example, the number of pull-up drivers 510 or the like used in the capability adjustment process is set to increase as the peak value of the voltage fluctuation increases.

As described above, the output control circuit 560 of the present embodiment sets the parameters of the capability adjustment process based on the voltage fluctuation of the wiring 573 detected by the detection circuit 575. Even in such an embodiment, it is possible to appropriately set the parameters of the capability adjustment process. The waveform of the wiring 572 is acquired and the parameters of the capability adjustment process may be set based on the voltage fluctuation of the wiring 572.

A fifth embodiment will be described. In the following, points different from the first embodiment will be mainly described, and descriptions of points common to the first embodiment will be omitted as appropriate.

Figure 23:
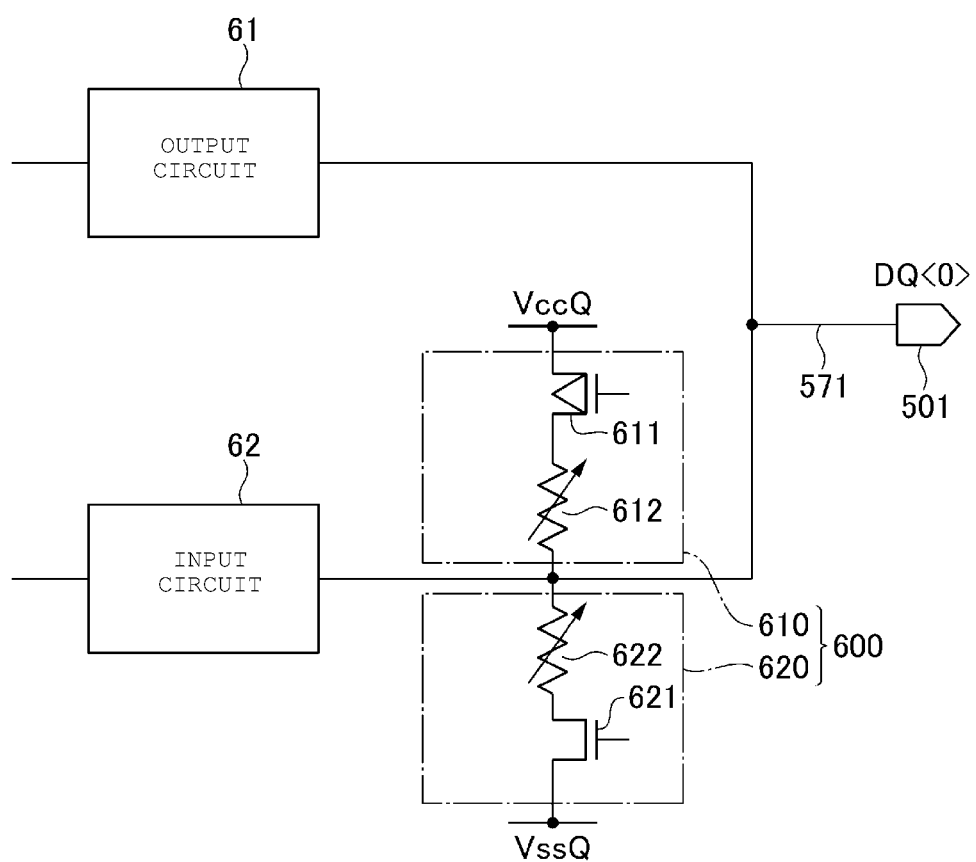
FIG. 23 is a view showing a configuration of an output circuit of a semiconductor memory device according to a fifth embodiment.

As described above, each of the pins 501, which is provided in the input/output terminal group 31, has a function as an "input pin" to which an input signal of the write data is input from the memory controller 1 in addition to a function as an "output pin" of outputting an output signal of the read data. As shown in FIG. 23, the wiring 571, which is connected to the pin 501, is provided with an output circuit 61 and an input circuit 62. The output circuit 61 corresponds to the output circuit 21b in the first embodiment (FIG. 12), and the input circuit 62 corresponds to the input circuit 21a in the first embodiment (FIG. 12).

The output circuit 61 is a circuit for changing the voltage of the pin 501 in response to the output signal to be output as the read data, and includes the pull-up driver 510 or the pull-down driver 520, the drive circuits 530 and 540, and the like, which have been described so far. The input circuit 62 is a circuit for acquiring an input signal which is input to the pin 501 as the write data. Since a known configuration may be adopted as a circuit configuration of the input circuit 62, its specific illustration and description are omitted.

A resistance adjustment circuit 600 is provided in a portion of the wiring 571 between the input circuit 62 and the pin 501. The resistance adjustment circuit 600 is also called an on die termination (ODT) circuit, and is a circuit for adjusting a terminating resistance of semiconductor memory device 2 so as to reduce reflected waves to the outside when a signal is input. The resistance adjustment circuit 600 has an ODT pull-up driver 610 and an ODT pull-down driver 620.

The ODT pull-up driver 610 is a circuit disposed between the reference voltage line to which VccQ is applied and the wiring 571. The ODT pull-up driver 610 has a p-channel MOS transistor 611 and a variable resistor 612. The variable resistor 612 is, for example, a p-channel MOS transistor. A resistance value of the variable resistor 612 is adjusted by the sequencer 41, for example. In the present embodiment, an operation of the ODT pull-up driver 610 is controlled by the output control circuit 560 that is a part of the sequencer 41.

The ODT pull-down driver 620 is a circuit arranged between the reference voltage line to which VssQ is applied and the wiring 571. The ODT pull-down driver 620 has an n-channel MOS transistor 621 and a variable resistor 622. The variable resistor 622 is, for example, an n-channel MOS transistor. A resistance value of the variable resistor 622 is adjusted by the sequencer 41, for example. In the present embodiment, an operation of the ODT pull-down driver 620 is controlled by the output control circuit 560 that is a part of the sequencer 41.

During the read operation, for example, the sequencer 41 turns off both the p-channel MOS transistor 611 and the n-channel MOS transistor 621. During the write operation, both the p-channel MOS transistor 611 and the n-channel MOS transistor 621 are turned on, and the resistance values of the variable resistors 612 and 622 are appropriately adjusted.

Since the ODT pull-up driver 610 is a circuit disposed between the reference voltage line to which VccQ is applied and the wiring 571, the ODT pull-up driver 610 can operate similarly to the pull-up driver 510 of the output circuit 61. Therefore, the ODT pull-up driver 610 can be regarded as being arranged in parallel with a plurality of pull-up drivers 510 between the wiring 571 and the wiring 572, as shown in FIG. 24.

Similarly, since the ODT pull-down driver 620 is a circuit disposed between the reference voltage line to which VssQ is applied and the wiring 571, the ODT pull-down driver 620 can operate similarly to the pull-down driver 520 of the output circuit 61. Therefore, the ODT pull-down driver 620 can be regarded as being arranged in parallel with a plurality of pull-down drivers 520 between the wiring 571 and the wiring 573, as shown in FIG. 24.

Therefore, in the present embodiment, during the read operation, the same capability adjustment process as in the first embodiment is executed by temporarily turning on the ODT pull-up driver 610 and the ODT pull-down driver 620. That is, in the present embodiment, the capability adjustment process is executed by operating the ODT pull-up driver 610 or the like, which is normally turned off during the read operation, instead of the pull-up driver 511 or the like in the first embodiment.

Figure 24:
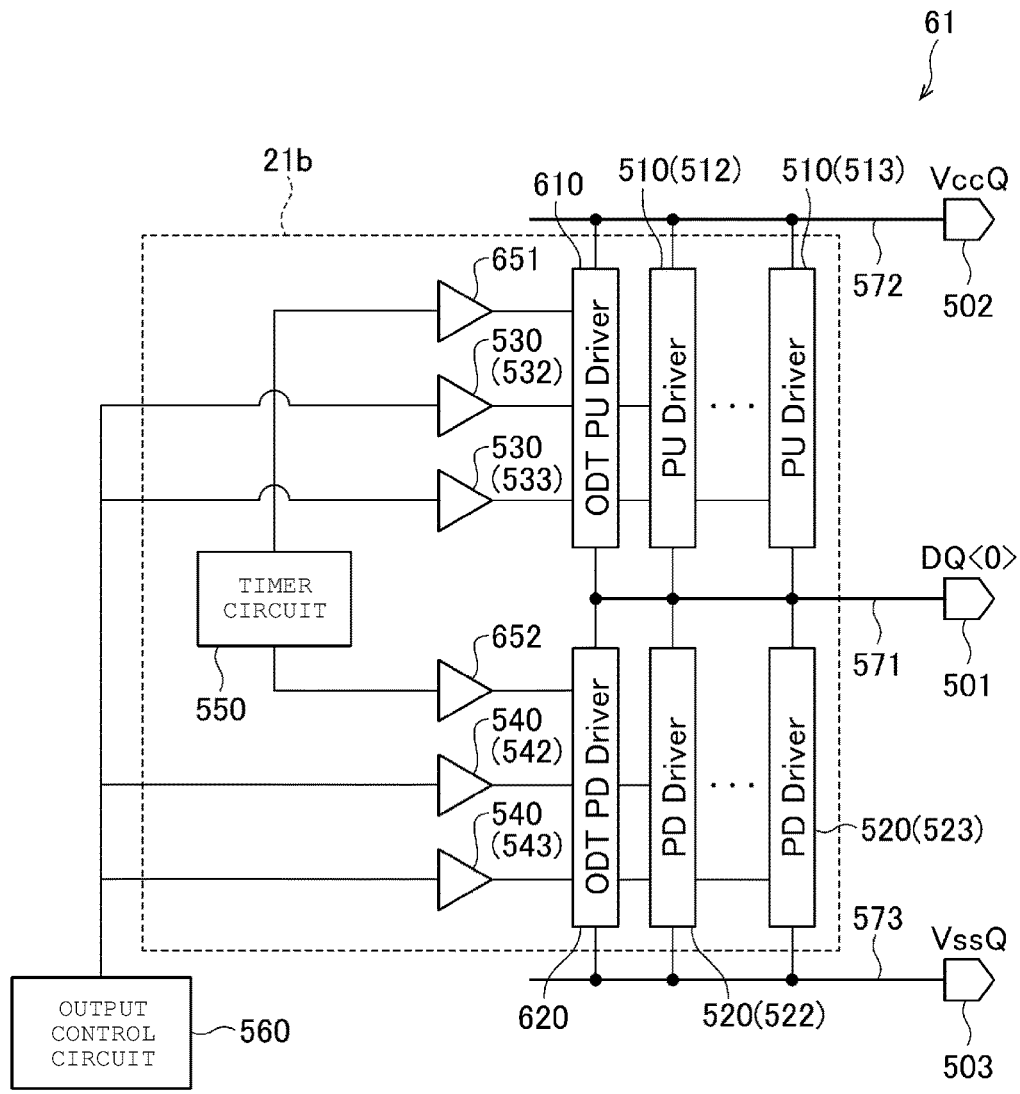
FIG. 24 is a view showing a configuration of an output circuit of the semiconductor memory device according to the fifth embodiment.

The operation of the ODT pull-up driver 610 is controlled by the drive circuit 651 in FIG. 24. In the present embodiment, when the control signal, which is input from the timer circuit 550 to the drive circuit 651, becomes H, the drive circuit 651 turns on the p-channel MOS transistor 611 and adjusts the resistance value of the variable resistor 612 to a predetermined value. When the control signal becomes L, the drive circuit 651 turns off both the p-channel MOS transistor 611 and the variable resistor 612.

Similarly, the operation of the ODT pull-down driver 620 is controlled by the drive circuit 652 in FIG. 24. In the present embodiment, when the control signal, which is input from the timer circuit 550 to the drive circuit 652, becomes H, the drive circuit 652 turns on the n-channel MOS transistor 621 and adjusts the resistance value of the variable resistor 622 to the predetermined value. When the control signal becomes L, the drive circuit 652 turns off both the n-channel MOS transistor 621 and the variable resistor 622.

As described above, the pin 501 of the present embodiment is connected to the resistance adjustment circuit 600 for adjusting the terminating resistance when the write data is input. The output control circuit 560 controls the operation of the resistance adjustment circuit 600 and performs the capability adjustment process by changing the terminating resistance. Even in such an embodiment, the same effects as those described in the first embodiment can be obtained.

A sixth embodiment will be described. In the following, points different from the first embodiment will be mainly described, and descriptions of points common to the first embodiment will be omitted as appropriate.

Figure 25:
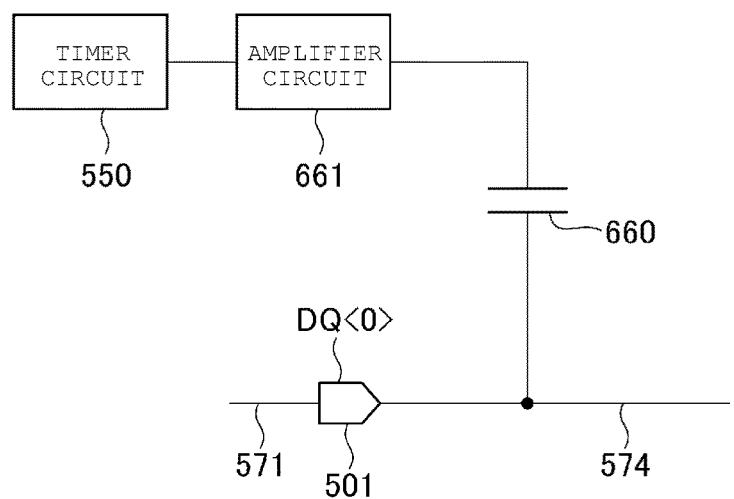
FIG. 25 is a view showing a configuration of an output pin and the vicinity of the output pin of a semiconductor memory device according to a sixth embodiment.

FIG. 25 schematically shows a configuration of the pin 501 and the vicinity of the pin 501 in the semiconductor memory device 2 according to the present embodiment. A wiring 574 shown in FIG. 25 is a wiring that connects between the pin 501 and the memory controller 1.

A capacitor 660 and an amplifier circuit 661 are provided in the semiconductor memory device 2 according to the present embodiment. One end of the capacitor 660 is connected to the pin 501 via the wiring 574 and the other end is connected to the amplifier circuit 661.

The timer circuit 550 of the present embodiment is connected to the amplifier circuit 661 as shown in FIG. 25, and is not connected to the drive circuit 530 as in the first embodiment (FIG. 14). The amplifier circuit 661 is a circuit that changes the voltage of one end of the capacitor 660 based on the control signal from the timer circuit 550. During a period when the control signal of the timer circuit 550 is H, the amplifier circuit 661 increases the voltage of one end of the capacitor 660. At this time, the voltage at the other end of the capacitor 660 is also increased due to so-called "capacitance coupling". That is, the voltage of pin 501 is also temporarily increased. Such operation of the amplifier circuit 661 is implemented by the output control circuit 560 controlling the operation of the timer circuit 550.

In such a configuration, when the control signal is switched to H as indicated by line L4 in FIG. 17, the speed of increase in the voltage of the pin 501 is temporarily increased. That is, the drive capability of the output circuit is temporarily increased. As described above, in the present embodiment, the same capability adjustment process as in the first embodiment is implemented by the output control circuit 560 changing the voltage of the capacitor 660 (voltage on a side opposite to the pin 501) via the amplifier circuit 661 or the like. Even in such an embodiment, the same effects as those described in the first embodiment can be obtained.

A location to which the other end of the capacitor 660 is connected may be a part of the wiring 574 as in the present embodiment or may be a part of the wiring 571.

A seventh embodiment will be described. In the following, points different from the first embodiment will be mainly described, and descriptions of points common to the first embodiment will be omitted as appropriate.

Figure 26:
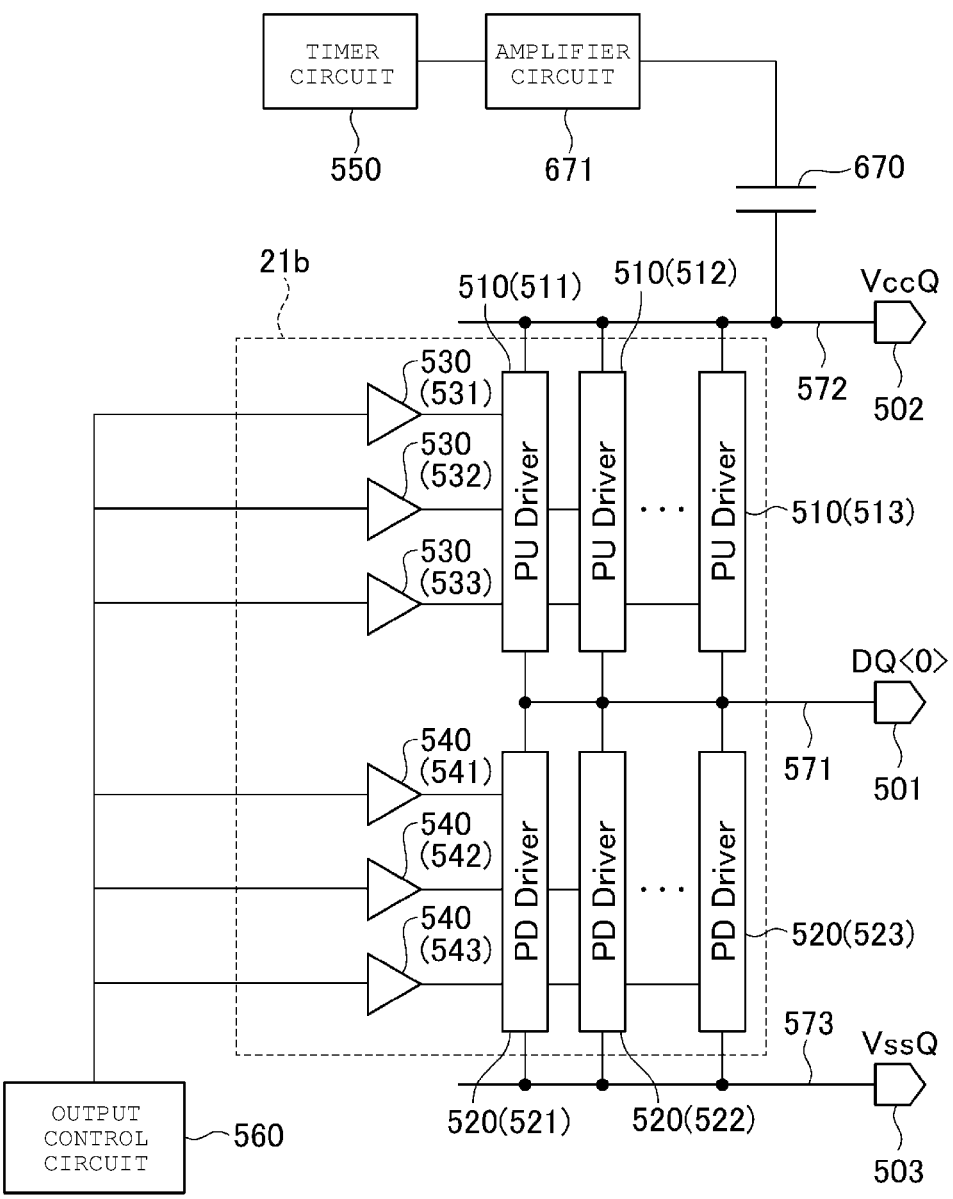
FIG. 26 is a view showing a configuration of an output circuit of a semiconductor memory device according to a seventh embodiment.

FIG. 26 schematically shows a configuration of the pin 501 and the vicinity of the pin 501 in the semiconductor memory device 2 according to the present embodiment.

A capacitor 670 and an amplifier circuit 671 are provided in the semiconductor memory device 2 according to the present embodiment. One end of the capacitor 670 is connected to the pin 502 via the wiring 572 and the other end is connected to the amplifier circuit 671.

The timer circuit 550 of the present embodiment is connected to the amplifier circuit 671 as shown in FIG. 26, and is not connected to the drive circuit 530 as in the first embodiment (FIG. 14). The amplifier circuit 671 is a circuit that changes the voltage of one end of the capacitor 670 based on the control signal from the timer circuit 550. During a period when the control signal of the timer circuit 550 is H, the amplifier circuit 671 increases the voltage of one end of the capacitor 670. At this time, the voltage at the other end of the capacitor 660 is also increased due to so-called "capacitance coupling". That is, the voltage of the pin 502 (that is, VccQ) is also temporarily increased. Such operation of the amplifier circuit 671 is implemented by the output control circuit 560 controlling the operation of the timer circuit 550.

In such a configuration, when the control signal is switched to H as indicated by line L4 in FIG. 17, the voltage of the wiring 572, which is the reference voltage line, is temporarily increased. At this time, the drive capability of the output circuit is temporarily increased due to the increased current that flows into the pin 501 through a part of the pull-up drivers 510 that are turned on.

As described above, in the present embodiment, the same capability adjustment process as in the first embodiment is implemented by the output control circuit 560 changing the voltage of the wiring 572 (voltage of the reference voltage line) via the amplifier circuit 661 or the like. Even in such an embodiment, the same effects as those described in the first embodiment can be obtained.

The voltage of the wiring 572 may be temporarily increased as in the present embodiment but may be temporarily decreased. Further, the voltage of the wiring 573 may be temporarily changed using the amplifier circuit 671 or the capacitor 670 in the same manner as described above.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
    an output pin configured for connection with a memory controller;
    an output circuit configured to output through the output pin a voltage signal that changes over time in accordance with one or more bits of data to be output to the memory controller;
    a control circuit configured to temporarily change a drive capability of the output circuit each time a voltage signal corresponding to one bit of the data is output through the output pin;
    a reference voltage line connected to the output circuit; and
    a detection circuit configured to detect a voltage fluctuation in the reference voltage line,
    wherein the control circuit sets a parameter for changing the drive capability of the output circuit based on the detected voltage fluctuation.

2. The semiconductor memory device according to claim 1, wherein
    the voltage signal corresponding to one bit of the data is output through the output pin over a first time period, and the control circuit changes the drive capability during a second time period that is shorter than the first time period.

3. The semiconductor memory device according to claim 2, wherein a start of the second time period is offset with respect to a start of the first time period, and an amount of the offset and a duration of the second time period are stored in a register of the control circuit.

4. The semiconductor memory device according to claim 3, wherein the amount of the offset and the duration of the second time period are specified in a control signal from the memory controller.

5. The semiconductor memory device according to claim 4, wherein the output circuit includes a plurality of pull-up driver circuits having outputs connected to the output pin and a plurality of pull-down driver circuits having outputs connected to the output pin, and one of the pull-up driver circuits and the pull-down driver circuits is turned on and off in accordance with the amount of the offset and the duration of the second time period stored in the register.

6. The semiconductor memory device according to claim 3, further comprising:
a timer circuit configured to output a control signal to the output circuit in accordance with the duration of the second time period stored in the register.

7. The semiconductor memory device according to claim 1, wherein
the output circuit includes
a driver for changing an electric resistance between the reference voltage line and the output pin, and
a drive circuit for the driver, and
the control circuit changes the drive capability of the output circuit by controlling an operation of the drive circuit.

8. The semiconductor memory device according to claim 1, wherein
the output circuit includes a plurality of drivers for changing an electric resistance between the reference voltage line and the output pin and a plurality of drive circuits for the plurality of drivers, respectively, and
the control circuit changes the drive capability of the output circuit by controlling an operation of a part of the drive circuits.

9. The semiconductor memory device according to claim 1, further comprising:
a capacitor of which one end is connected to the output pin,
wherein the control circuit changes the drive capability of the output circuit by changing a voltage at the other end of the capacitor.

10. The semiconductor memory device according to claim 1, wherein
the output circuit includes
a driver for changing an electric resistance between another reference voltage line and the output pin, and
a drive circuit for the driver, and
the control circuit changes the drive capability of the output circuit by changing a voltage of the another reference voltage line.

11. The semiconductor memory device according to claim 1, wherein
the control circuit temporarily changes the drive capability of the output circuit over a time period that ends during a first half of an entire period for outputting the one bit of data through the output pin.

12. A semiconductor memory device comprising:
a signal pin configured for connection with a signal pin of a memory controller;
an output circuit including a plurality of drivers for changing an electric resistance between a reference voltage line and the signal pin and a plurality of drive circuits for the plurality of drivers, respectively;
a detection circuit configured to detect a voltage fluctuation in the reference voltage line; and
a control circuit configured to control one of the drive circuits to turn on and off one of the drivers for a predetermined period of time each time a voltage signal corresponding to one bit of data is output through the signal pin,
wherein the voltage signal corresponding to the one bit of the data is output through the signal pin over an output time period that is longer than the predetermined time period, and the control circuit sets a parameter for changing the drive capability of the output circuit based on the detected voltage fluctuation.

13. The semiconductor memory device according to claim 12, wherein a start of the predetermined time period is offset with respect to a start of the output time period, and an amount of the offset and a duration of the predetermined time period are stored in a register of the control circuit.

14. The semiconductor memory device according to claim 13, wherein
the amount of the offset and the duration of the predetermined time period are specified in a control signal from the memory controller.

15. The semiconductor memory device according to claim 13, wherein
the predetermined time period ends during a first half of the output time period.

16. The semiconductor memory device according to claim 13, wherein
the predetermined time period begins prior to a start of the output time period and ends when the output time period begins.

17. The semiconductor memory device according to claim 12, further comprising:
a timer circuit configured to issue a control signal to turn off said one of the drivers when the predetermined period of time has elapsed from when said one of the drivers was turned on.

* * * * *